(12) United States Patent
Huang

(10) Patent No.: US 10,529,821 B2
(45) Date of Patent: Jan. 7, 2020

(54) EPITAXIAL STRUCTURE OF N-FACE GROUP III NITRIDE, ACTIVE DEVICE, AND METHOD FOR FABRICATING THE SAME WITH INTEGRATION AND POLARITY INVERSION

(71) Applicant: Chih-Shu Huang, Taipei (TW)

(72) Inventor: Chih-Shu Huang, Taipei (TW)

( * ) Notice: Subject to any disclaimer, the term of this patent is extended or adjusted under 35 U.S.C. 154(b) by 0 days.

(21) Appl. No.: 15/997,907

(22) Filed: Jun. 5, 2018

(65) Prior Publication Data
US 2018/0350944 A1  Dec. 6, 2018

(30) Foreign Application Priority Data
Jun. 6, 2017 (TW) .............................. 106118759 A

(51) Int. Cl.
*H01L 29/66* (2006.01)
*C30B 25/04* (2006.01)
(Continued)

(52) U.S. Cl.
CPC ........ *H01L 29/66462* (2013.01); *C30B 25/04* (2013.01); *C30B 25/183* (2013.01);
(Continued)

(58) Field of Classification Search
None
See application file for complete search history.

(56) References Cited

U.S. PATENT DOCUMENTS 9,960,264 B1 * 5/2018 Chen ................... H01L 29/7786
10,164,081 B2 * 12/2018 Morvan ............ H01L 29/66462
(Continued)

FOREIGN PATENT DOCUMENTS

| CN | 104952709 A | 9/2015 |
| TW | 200903805 A | 1/2009 |

(Continued)

OTHER PUBLICATIONS

Chen, Kevin J., et al. "Recent Development in Flourine-Ion-Implanted GaN-Based Heterojunction Power Devices." The 1st IEEE Workshop on Wide Bandgap Power Devices and Applications, 2013, doi:10.1109/wipda.2013.6695570. (Year: 2013).*
(Continued)

*Primary Examiner* — J. E. Schoenholtz
(74) *Attorney, Agent, or Firm* — Rosenberg, Klein & Lee

(57) ABSTRACT

The present invention provides an epitaxial structure of N-face group III nitride, its active device, and the method for fabricating the same. By using a fluorine-ion structure in device design, a 2DEG in the epitaxial structure of N-face group III nitride below the fluorine-ion structure will be depleted. Then the 2DEG is located at a junction between a i-GaN channel layer and a i-$Al_y$GaN layer, and thus fabricating GaN enhancement-mode AlGaN/GaN high electron mobility transistors (HEMTs), hybrid Schottky barrier diodes (SBDs), or hybrid devices. After the fabrication step for polarity inversion, namely, generating stress in a passivation dielectric layer, the 2DEG will be raised from the junction between the i-GaN channel layer and the i-$Al_y$GaN layer to the junction between the i-GaN channel layer and the i-$Al_x$GaN layer.

8 Claims, 37 Drawing Sheets

(51) Int. Cl.

| | | |
|---|---|---|
| *C30B 29/40* | (2006.01) | |
| *H01L 21/02* | (2006.01) | |
| *H01L 29/778* | (2006.01) | |
| *H01L 29/10* | (2006.01) | |
| *C30B 25/18* | (2006.01) | |
| *H01L 29/40* | (2006.01) | |
| *H01L 29/423* | (2006.01) | |
| *H01L 27/06* | (2006.01) | |
| *H01L 29/872* | (2006.01) | |
| *H01L 29/205* | (2006.01) | |
| *H01L 29/207* | (2006.01) | |
| *H01L 21/8234* | (2006.01) | |
| *H01L 21/8252* | (2006.01) | |
| *H01L 27/085* | (2006.01) | |

(52) U.S. Cl.
CPC ...... *C30B 29/406* (2013.01); *H01L 21/02381* (2013.01); *H01L 21/02458* (2013.01); *H01L 21/8252* (2013.01); *H01L 21/823412* (2013.01); *H01L 21/823462* (2013.01); *H01L 27/0605* (2013.01); *H01L 27/085* (2013.01); *H01L 29/1066* (2013.01); *H01L 29/1075* (2013.01); *H01L 29/205* (2013.01); *H01L 29/207* (2013.01); *H01L 29/402* (2013.01); *H01L 29/4236* (2013.01); *H01L 29/42376* (2013.01); *H01L 29/66212* (2013.01); *H01L 29/7781* (2013.01); *H01L 29/7783* (2013.01); *H01L 29/7786* (2013.01); *H01L 29/872* (2013.01)

(56) References Cited

U.S. PATENT DOCUMENTS

| | | | | |
|---|---|---|---|---|
| 2010/0084687 A1* | 4/2010 | Chen | ............... | H01L 29/207 257/194 |
| 2010/0244101 A1* | 9/2010 | Kokawa | ............... | H01L 21/0237 257/201 |
| 2013/0083569 A1* | 4/2013 | Minoura | ............... | H01L 29/66462 363/37 |
| 2014/0374771 A1* | 12/2014 | Umeno | ............... | H01L 29/201 257/76 |
| 2015/0303290 A1* | 10/2015 | Ueno | ............... | H01L 29/7781 257/194 |
| 2016/0064488 A1* | 3/2016 | Takado | ............... | H01L 29/7783 257/20 |
| 2017/0250273 A1* | 8/2017 | Schultz | ............... | H01L 29/7783 |
| 2018/0350933 A1* | 12/2018 | Huang | ............... | H01L 27/0883 |

FOREIGN PATENT DOCUMENTS

| | | |
|---|---|---|
| TW | 200947703 A | 11/2009 |
| TW | 201242016 A | 10/2012 |

OTHER PUBLICATIONS

Gamarra, Piero, et al. "Optimisation of a Carbon Doped Buffer Layer for AlGaN/GaN HEMT Devices." Journal of Crystal Growth, vol. 414, 2015, pp. 232-236., doi:10.1016/j.jcrysgro.2014.10.025. (Year: 2014).*

Tang, Zhikai, et al. "600-V Normally Off SiNx/AlGaN/GaN MIS-HEMT With Large Gate Swing and Low Current Collapse." IEEE Electron Device Letters, vol. 34, No. 11, 2013, pp. 1373-1375., doi:10.1109/led.2013.2279846. (Year: 2013).*

Yang, Shu, et al. "Fabrication and Characterization of Enhancement-Mode High-E Rm LaLu3—AlGaN/GaN MIS-HEMTs." IEEE Transactions on Electron Devices, vol. 60, No. 10, 2013, pp. 3040-3046., doi:10.1109/ted.2013.2277559. (Year: 2013).*

Enhancement/Depletion-mode HEMT Technology for III-Nitride Mixed-Signal and RF Applications, Ruonan Wang, A Thesis Submitted to The Hong Kong University of Science and Technology in Partial Fulfillment of the Requirement for the Degree of Doctor of Philosophy in the Department of the Electronic and Computer Engineering, Jan. 2008.

AlGaN/GaN MBE 2DEG Heterostructures: Interplay between Surface, Interfaceand Device-Properties, Von der Fakultät für Elektrotechnik and Informationstechnik der Rheinisch-Westfälischen Technischen Hochschule Aachen zur Erlangung des akademischen Grades eines Doktors der Ingenieurwissenschaften genehmigte Dissertation, Martin Kocan aus Bratislava, Slowakei, Tag der mündlichen Prüfung: Jul. 16, 2003.

* cited by examiner

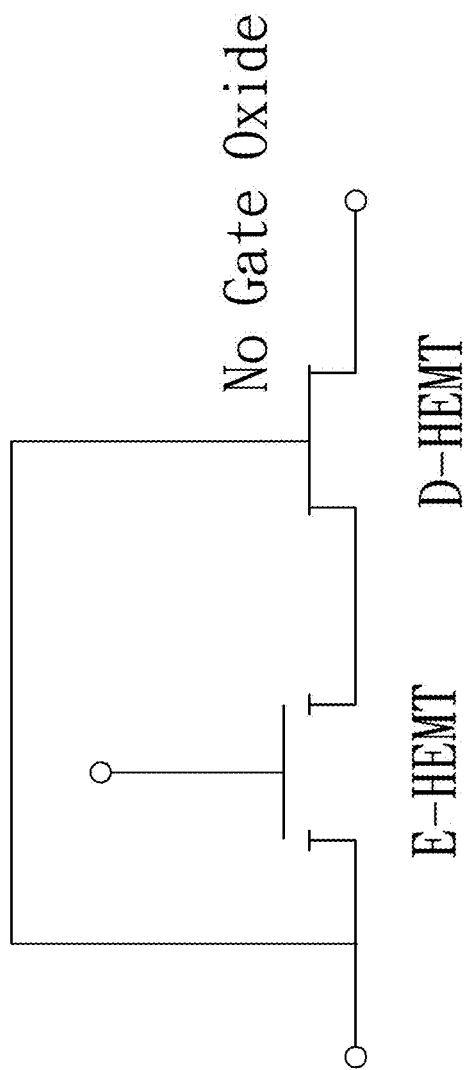

EPITAXIAL STRUCTURE OF N-FACE GROUP III NITRIDE, ACTIVE DEVICE, AND METHOD FOR FABRICATING THE SAME WITH INTEGRATION AND POLARITY INVERSION

FIELD OF THE INVENTION

The present invention relates generally to an epitaxial structure, and particularly to an epitaxial structure of N-face (Nitride-Face) group III nitride grown in series on semiconductors. The advantage of the present invention is that i-Al$_x$GaN grown on the N-face polarity will have less defects. By using the fabrication method according to the present invention, namely, by taking advantages of the stress generated by the passivation dielectric layer, the N-face polarity can be inverted to the Ga-face polarity. Thereby, the 2DEG can be transferred from the interface of i-GaN/i-Al$_y$GaN in the i-GaN channel layer to the interface of i-Al$_x$GaN/i-GaN in the i-GaN channel layer. In addition to giving lower i-Al$_x$GaN surface traps, while the i-Al$_y$GaN became the role of blocking buffer trap electrons from entering the channel layer, and hence easing the problem of current collapse. Furthermore, the present invention also provides a gate moatmoat structure located in the i-Al$_x$GaN layer and on both sides of the fluorine-ion structure.

BACKGROUND OF THE INVENTION

According to the prior art, the most common structures to achieve an enhancement-mode AlGaN/GaN high electron mobility transistor (E-mode AlGaN/GaN HEMT) include: 1. Ga-face p-GaN gate E-mode HEMT structure, and 2. N-face Al$_x$GaN gate E-mode HEMT structure. Nonetheless, as implied by their names, only the gate region will be p-GaN or AlxGaN.

The most common fabrication method is to grow an additional P—GaN layer on the tradition epitaxial structure of depletion-mode (D-mode) AlGaN/GaN HEMT. Afterwards, etch p-GaN outside the gate region using dry etching while maintaining the completeness of the thickness of the underlying epitaxial layer. Because if the underlying epitaxial layer is etched too much, the two-dimensional electron gas (2DEG) will not be formed at the interface AlGaN/GaN of a Ga-face p-GaN gate E-mode HEMT structure. Thereby, using dry etching is challenging because the etching depth is hard to control and nonuniformity in thickness still occurs in every epitaxial layer of an epitaxial wafer. Besides, both this epitaxial structure and the normal D-Mode AlGaN/GaN HEMT epitaxial structure face the problems related to current collapse, such as buffer traps and surface traps, requiring further resolution.

Accordingly, to improve the above drawbacks, the present invention provides a novel epitaxial structure of N-face group III nitride, an active device formed by using the epitaxial structure after polarity inversion, and the fabrication method for integration.

SUMMARY

An objective of the present invention is to provide a novel epitaxial structure of N-face group III nitride, an active device formed by using the epitaxial structure after polarity inversion, and the fabrication method for integration for solving the process bottleneck encountered in the epitaxial structure of HEMTs. In addition, multiple types of high-voltage and high-speed active devices can be formed on the substrate of the epitaxial structure of N-face group III nitride at the same time.

Another objective of the present invention is make the 2DEG in an epitaxial structure of N-face group III nitride under the fluorine-ion structure become depleted after polarity inversion of the active region (AlGaN/GaN/AlGaN). Thereby, E-mode AlGaN/GaN high electron mobility transistors (HEMTs), hybrid Schottky barrier diodes (SBDs), or hybrid E-mode AlGaN/GaN HEMTs can be fabricated.

In order to achieve the above objectives, the present invention provides an epitaxial structure of N-face AlGaN/GaN, which comprises a silicon substrate, a carbon-doped (C-doped) buffer layer on the silicon substrate, a C-doped GaN layer on the C-doped buffer layer, an i-Al$_y$GaN layer on the C-doped GaN layer, an i-GaN channel layer on the i-Al$_y$GaN layer, an i-Al$_x$GaN layer on the i-GaN channel layer, a fluorine-ion structure in the i-Al$_x$GaN layer, a first gate dielectric layer on the fluorine-ion structure, where x=0.1~0.3 and y=0.05~0.75, and a gate moat structure located in the i-Al$_x$GaN layer and on both sides of the fluorine-ion structure.

By using the epitaxial structure of N-face AlGaN/GaN, the present invention further provides multiple types of HEMTs and SBD devices having the fluorine-ion structure and the moat structure as well as the method for fabricating the same with integration.

BRIEF DESCRIPTION OF THE DRAWINGS

FIG. 3B-2 shows a schematic diagram of the device isolation process according to the second embodiment of the present invention;

FIG. 3C-1 shows a schematic diagram of forming the fluorine-ion structure on the structure shown in FIG. 3B-1;

FIG. 3C-2 shows a schematic diagram of forming the fluorine-ion structure on the structure shown in FIG. 3B-2;

FIG. 3D-1 shows a schematic diagram of forming the first gate dielectric layer on the structure shown in FIG. 3C-1;

FIG. 3D-2 shows a schematic diagram of forming the first gate dielectric layer on the structure shown in FIG. 3C-2;

FIG. 3E-1 shows a schematic diagram of forming the first gate electrode, the source metal interconnect, and the drain metal interconnect on the structure shown in FIG. 3D-1;

FIG. 3E-2 shows a schematic diagram of forming the first gate electrode, the source metal interconnect, and the drain metal interconnect on the structure shown in FIG. 3D-2;

FIG. 4D-1 shows the distribution of various defects existing in a traditional Ga-face HEMT causing current collapse;

FIG. 4D-2 shows a schematic diagram of Ga-face and N-face GaN grown on a substrate;

FIG. 5B-1 shows a schematic diagram of the device isolation process according to the first embodiment of the present invention;

FIG. 5B-2 shows a schematic diagram of the device isolation process according to the second embodiment of the present invention;

FIG. 5C-1 shows a schematic diagram of forming the fluorine-ion structure on the structure shown in FIG. 5B-1;

FIG. 5C-2 shows a schematic diagram of forming the fluorine-ion structure on the structure shown in FIG. 5B-2;

FIG. 5D-1 shows a schematic diagram of forming the gate oxide layer on the structure shown in FIG. 5C-1;

FIG. 5D-2 shows a schematic diagram of forming the gate oxide layer on the structure shown in FIG. 5C-2;

FIG. 5E-1 shows a schematic diagram of forming the gate electrode and the metal interconnect on the structure shown in FIG. 5D-1;

FIG. 5E-2 shows a schematic diagram of forming the gate electrode and the metal interconnect on the structure shown in FIG. 5D-2;

FIG. 7A-1 shows a schematic diagram of the device isolation process according to the first embodiment of the present invention;

FIG. 7A-2 shows a schematic diagram of the device isolation process according to the second embodiment of the present invention;

FIG. 7B-1 shows a schematic diagram of forming the fluorine-ion structure and the gate oxide layer on the structure shown in FIG. 7A-1 according to the present invention;

FIG. 7B-2 shows a schematic diagram of forming the fluorine-ion structure and the gate oxide layer on the structure shown in FIG. 7A-2 according to the present invention;

FIG. 7C-1 shows a schematic diagram of forming the gate electrode and the metal interconnect on the structure shown in FIG. 7B-1;

FIG. 7C-2 shows a schematic diagram of forming the gate electrode and the metal interconnect on the structure shown in FIG. 7B-2;

FIG. 8A-1 shows a first structure diagram of a hybrid SBD formed by cascoding an E-mode N-face AlGaN/GaN HEMT with polarity inversion and gate moat structure and an AlGaN/GaN SBD according to the present invention;

FIG. 8A-2 shows a second structure diagram of a hybrid SBD formed by cascoding an E-mode N-face AlGaN/GaN HEMT with polarity inversion and gate moat structure and an AlGaN/GaN SBD according to the present invention;

DETAILED DESCRIPTION

Figure 1A:
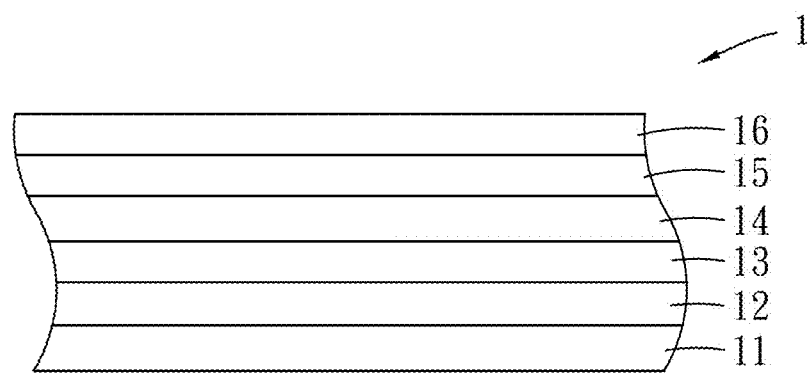
FIG. 1A shows a first structure diagram of the epitaxial structure of the N-face AlGaN/GaN HEMT according to the present invention.
Figure 1B:
FIG. 1B shows a second structure diagram of the epitaxial structure of the N-face AlGaN/GaN HEMT according to the present invention.

FIG. 1A shows a first structure diagram of the epitaxial structure of the N-face AlGaN/GaN HEMT according to the present invention. The epitaxial structure 1 comprises sequentially a silicon substrate 11, a C-doped buffer layer 12, a C-doped GaN layer 13, an i-Al$_y$GaN layer 14, an i-GaN channel layer 15, and an i-Al$_x$GaN layer 16. The epitaxial structure 1 comprises the i-Al$_y$GaN layer 14. After a polarity inversion process in the active region (AlGaN/GaN/AlGaN), the i-Al$_y$GaN layer 14 can function to block buffer trapped electrons from entering the channel layer (the i-GaN channel layer 15), and thus reducing the phenomenon of device current collapse. FIG. 1B shows a second structure diagram of the epitaxial structure of the N-face AlGaN/GaN HEMT according to the present invention. The main consideration is that if the i-Al$_y$GaN layer 14 is grown on the C-doped GaN layer 13, the problem of significant lattice mismatch will occur. Thereby, the i-Al$_z$GaN grading buffer layer 21 will be added, where z=0.0~10.75.

According to the first embodiment of the present invention, the structures of FIGS. 1A and 1B can be further applied in fabricating a fluorine-ion-implanted E-mode N-face AlGaN/GaN HEMT with polarity inversion and gate moat structure.

Figure 2A:
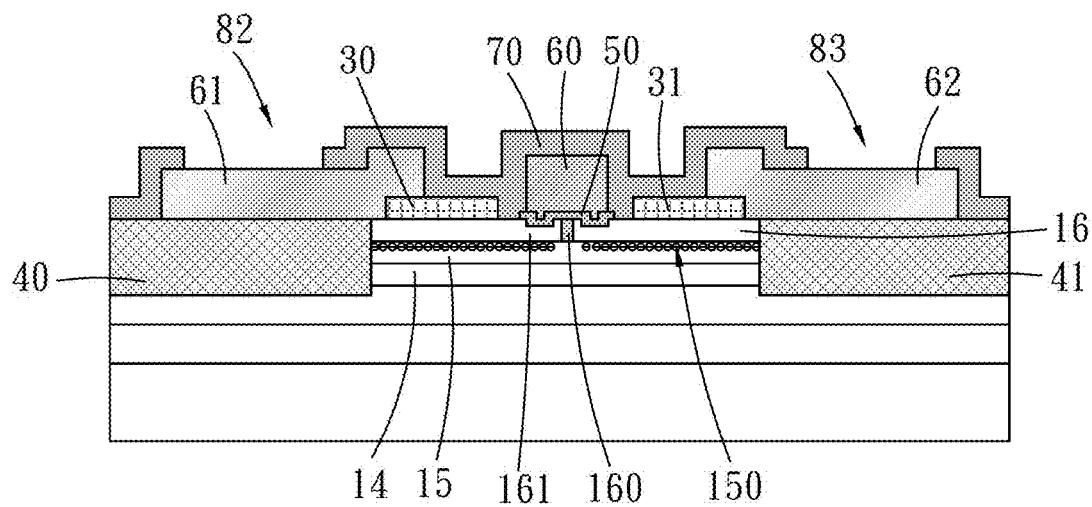
FIG. 2A shows a first structural schematic diagram of fluorine-ion-implanted E-mode N-face AlGaN/GaN HEMT with polarity inversion and gate moat structure according to the present invention.

FIG. 2A shows a first structural schematic diagram of E-mode N-face AlGaN/GaN HEMT with polarity inversion (namely, generating stress by the passivation dielectric layer) by implanting fluorine ions into the i-Al$_x$GaN layer 16 according to the present invention. As shown in the figure, the E-mode N-face AlGaN/GaN HEMT with polarity inversion according to the present invention is characterized in including the epitaxial structures 1 (as shown in FIG. 1A), 2 (as shown in FIG. 1B) of N-face AlGaN/GaN and the fluorine-on structure 160 located in the i-Al$_x$GaN layer 16. Although the 2DEG 150 is formed in the i-GaN channel layer 15 at the junction between the i-Al$_x$GaN layer 16 and the i-GaN channel layer 15, due to the existence of the fluorine-ion structure 160, the 2DEG 150 in the i-GaN channel layer 15 below the fluorine-ion structure 160 is depleted. Finally, the polarity of the active region (i-Al$_x$GaN/i-GaN/i-Al$_y$GaN) is inverted from the N-face polarity to the Ga-face polarity by using the stress generated by the passivation dielectric layer 70. This explains why the 2DEG 150 shown in FIG. 2A is located in the i-GaN channel layer 15 at the interface of i-Al$_x$GaN/i-GaN after the fabrication is completed: the original N-face polarity has been inverted to the Ga-face polarity.

As shown in FIG. 2A, according to the present invention, the dry etching method is adopted for etching the two gate moat structures 161 on the i-Al$_x$GaN layer 16 on both sides of the fluorine-ion structure 160. The main purpose of the two gate moat structures 161 is to avoid lateral diffusion of fluorine ions at high-temperature operations, which will change the electrical characteristics of devices. In addition, the gate moat structures 161 enable the gate electrode to envelop a part of the fluorine-ion structure 160. Thereby, the control of the gate on the device will be stronger, resulting in faster device switching and lower switching loss.

Figure 2B:
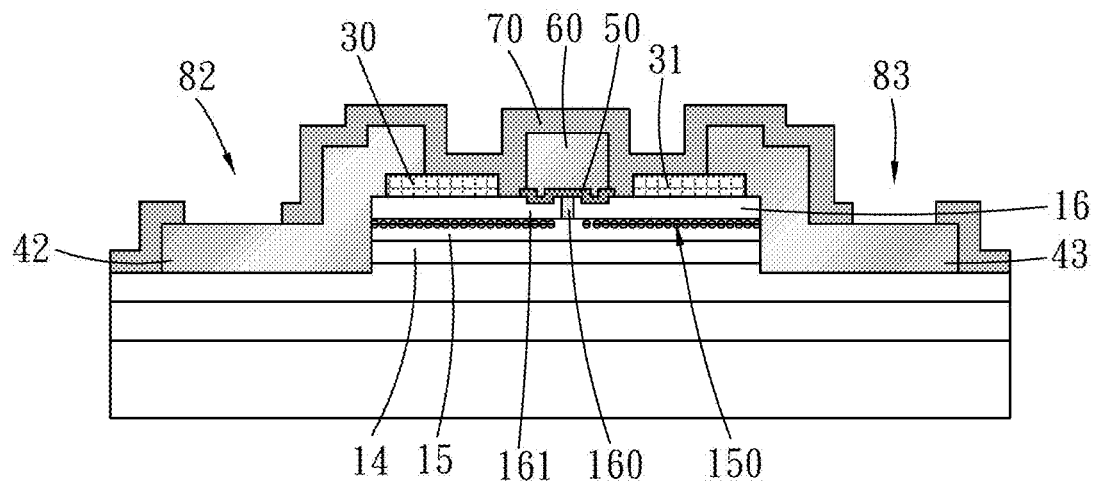
FIG. 2B shows a second structural schematic diagram of fluorine-ion-implanted E-mode N-face AlGaN/GaN HEMT with polarity inversion and gate moat structure according to the present invention.

According to the structure of the E-mode N-face AlGaN/GaN HEMT with polarity inversion according to the present invention, a first source ohmic-contact electrode 30 (namely, the first source electrode) and a first drain ohmic-contact electrode 31 (namely, the first drain electrode) are formed on the epitaxial structure 1 of N-face AlGaN/GaN. They are disposed on the surface of the i-Al$_x$GaN layer 16 of the epitaxial structure 1 of N-face AlGaN/GaN, respectively. By using dry etching, two gate moat structures 161 are formed in the i-Al$_x$GaN layer 16 on both sides of the predetermined location for the fluorine-ion structure 160. Next, by implanting fluorine ions, the fluorine-ion structure 160 is formed. Afterwards, a first gate dielectric layer 50 is formed on the fluorine-ion structure 160, and a first gate electrode 60 is formed on the first gate dielectric layer 50. In addition, the source metal interconnect 61 and the drain metal interconnect 62 connected with the first source ohmic-contact electrode 30 and the first drain ohmic-contact electrode 31 as well as the metal gate interconnect 601 are formed concurrently. The part labels 61, 62, 601 belong to the same metal layer as the part label 60. For clarity, different part labels are used to represent the metal interconnect of respective electrodes. Then, the whole epitaxial wafer is coated with a passivation dielectric layer 70. By using the stress generated by the passivation dielectric layer 70, the polarity of the active region (i-Al$_x$GaN 16/i-GaN channel layer 15/i-Al$_y$GaN layer 14) is inverted from the N-face polarity to the Ga-face polarity, which moves the 2DEG 150 in the i-GaN channel layer 15 from the interface of i-GaN channel layer 15/i-Al$_y$GaN layer 14 to the interface of i-Al$_x$GaN 16/i-GaN channel layer 15. Finally, etch the passivation dielectric layer 70 to expose the bonding pads for source, drain, and gate electrodes as well as the scribe lines between devices on the epitaxial wafer. Besides, likewise, FIG. 2B shows a second structural schematic diagram of fluorine-ion-implanted E-mode N-face AlGaN/GaN HEMT with polarity inversion and gate moat structure according to the present invention. The difference between FIG. 2B and FIG. 2A is in adopting the method of multiple-energy destructive ion implantation 40, 41 or the method of drying etching 42, 43.

Figure 2C:
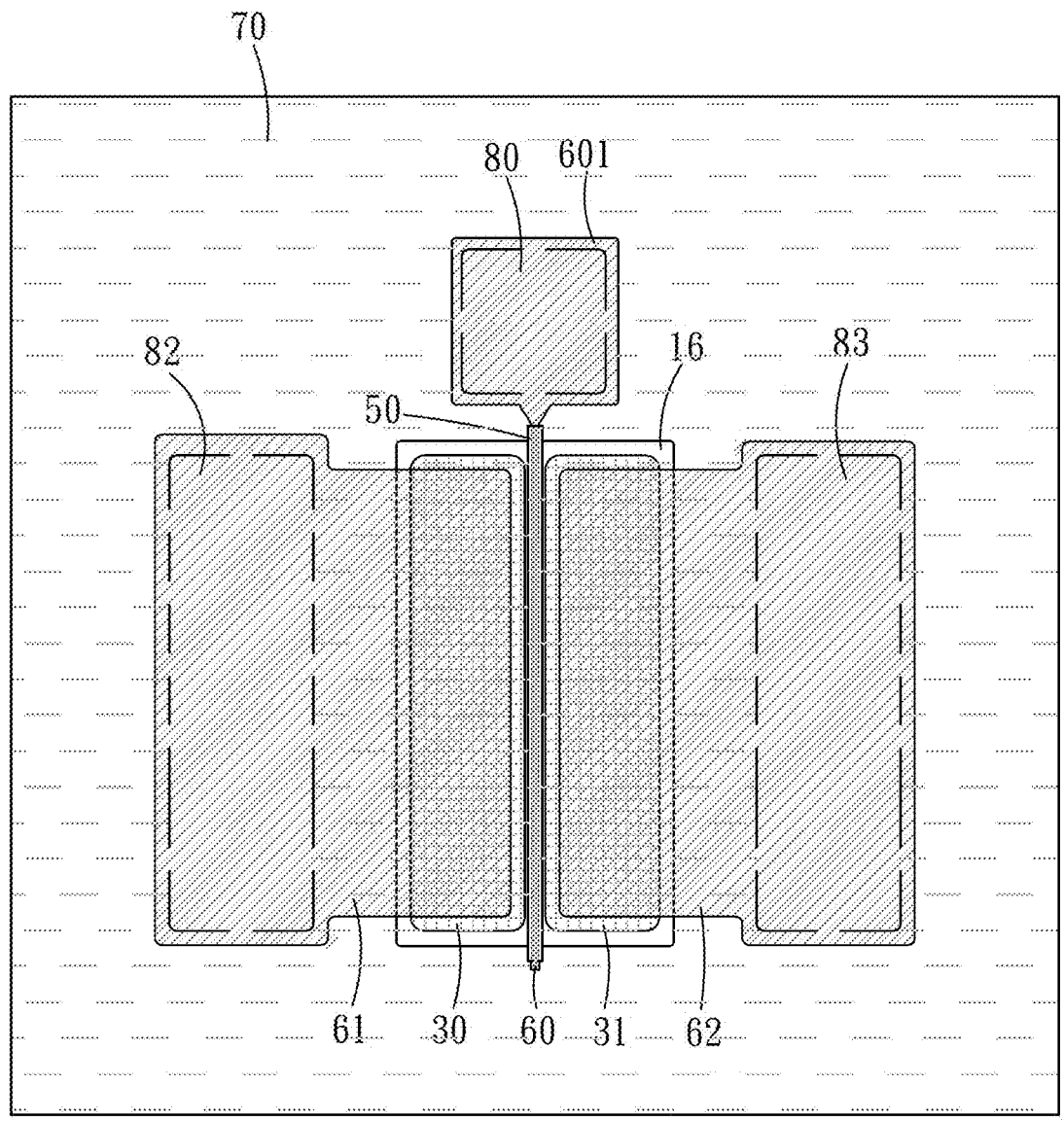
FIG. 2C shows a top view of fluorine-ion-implanted E-mode N-face AlGaN/GaN HEMT with polarity inversion and gate moat structure according to the present invention.

Please refer to FIG. 2C, which shows a top view of fluorine-ion-implanted E-mode N-face AlGaN/GaN HEMT with polarity inversion and gate moat structure according to the present invention. As shown in the figure, FIG. 2C includes a first gate bonding pad 80, a source bonding pad 82, and a drain bonding pad 83, while a first gate bonding pad 80 in FIG. 2C is also the cathode bonding pad 81. In addition, the locations of the i-Al$_x$GaN layer 16, the gate moat structures 161, the first source electrode 30, the first drain electrode 31, a first gate dielectric layer 50, the first gate electrode 60, the first source metal interconnect 61, and the first drain metal interconnect 62 are illustrated in FIG. 2C.

In the following, the method for fabricating the first embodiment will be illustrated. Nonetheless, the method as well as the layout for the metal interconnect is not limited to the method according to the present embodiment.

Figure 3A:
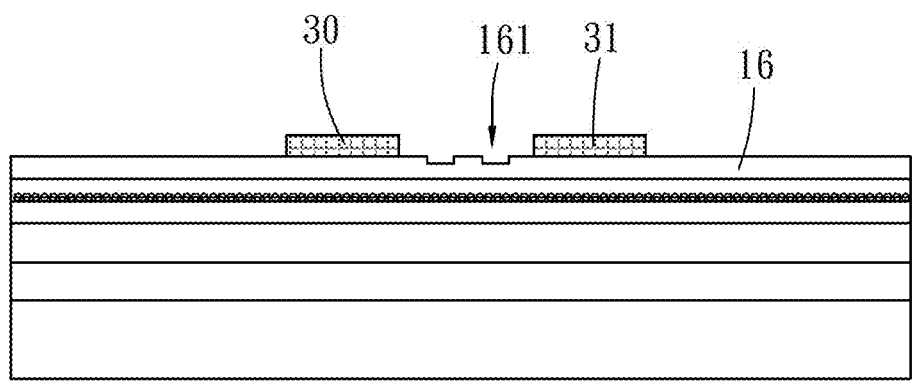
FIG. 3A shows a schematic diagram of forming the moat structure, the source ohmic-contact electrode, and the drain ohmic-contact electrode on the epitaxial structure of N-face AlGaN/GaN according to the present invention.

Please refer to FIG. 3A, which shows a schematic diagram of forming the moat structure, the source ohmic-contact electrode, and the drain ohmic-contact electrode on the epitaxial structure of N-face AlGaN/GaN according to the present invention. Step S11: Form the source ohmic-contact electrode 30 and the drain ohmic-contact electrode 31. In this step, the metal vapor deposition method is adopted for coating a metal layer, for example, a metal layer formed by Ti/Al/Ti/Au or Ti/Al/Ni/Au, on the epitaxial structure 1 of N-face AlGaN/GaN. Then, the metal lift-off method is adopted for patterning the coated metal layer and forming the first source electrode 30 and the first drain electrode 31 on the epitaxial wafer (the epitaxial structure 1 of N-face AlGaN/GaN). Afterwards, after a 700~900° C. thermal treatment for 30 seconds, the first source electrode 30 and the first drain electrode 31 become ohmic-contact electrodes. Next, by using dry etching, the two gate moat structures 161 are formed in the i-Al$_x$GaN layer 16 on both sides of the predetermined location for the fluorine-ion structure 160.

Figures 1, 3B:
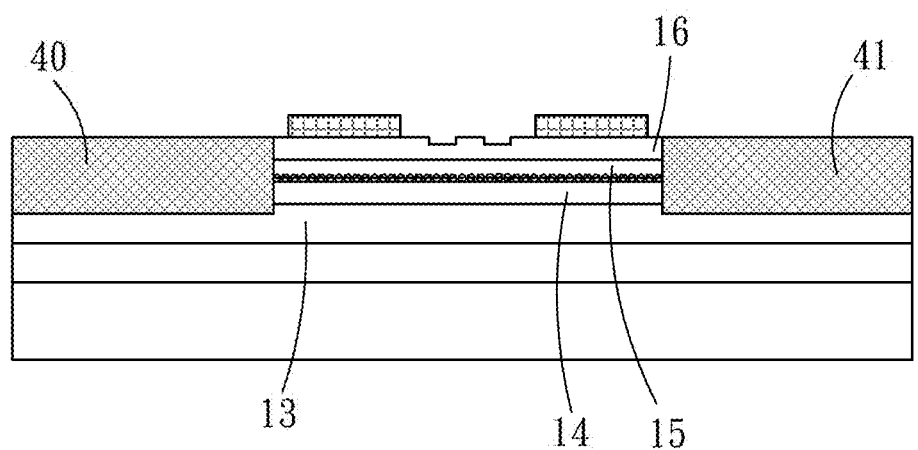
FIG. 3B-1 shows a schematic diagram of the device isolation process according to the first embodiment of the present invention.

Please refer to FIG. 3B-1, which shows a schematic diagram of the device isolation process according to the first embodiment of the present invention. Step S12: Perform device isolation. In this step, the multiple-energy destructive ion implantation 40, 41 is adopted. In general, heavy atoms such as boron or oxygen are used for isolating devices.

Figures 2, 3B:
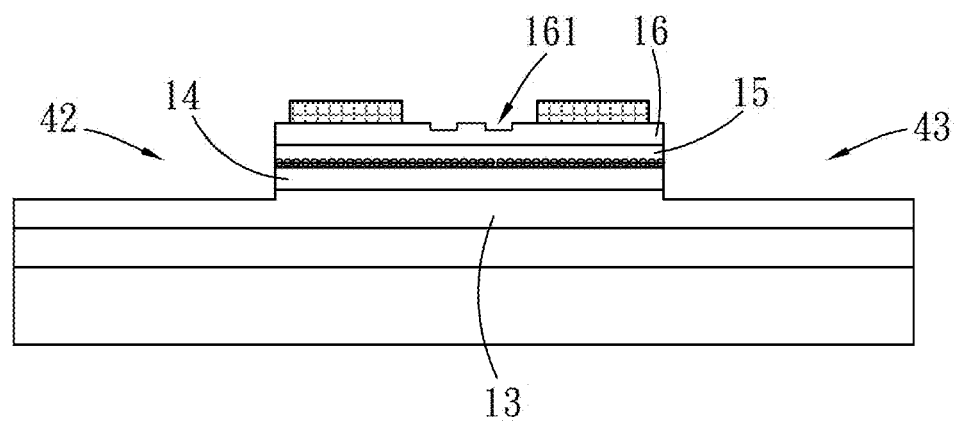

Alternatively, FIG. 3B-2 shows a schematic diagram of the device isolation process according to the second embodiment of the present invention. The method dry etching 42, 43 is adopted instead. Devices are isolated by etching the i-Al$_x$GaN layer 16, the i-GaN channel layer 15, and the i-Al$_y$GaN layer 14 of the epitaxial structure 1 of N-face AlGaN/GaN to the highly resistive C-doped GaN layer 13.

Figures 1, 3C:
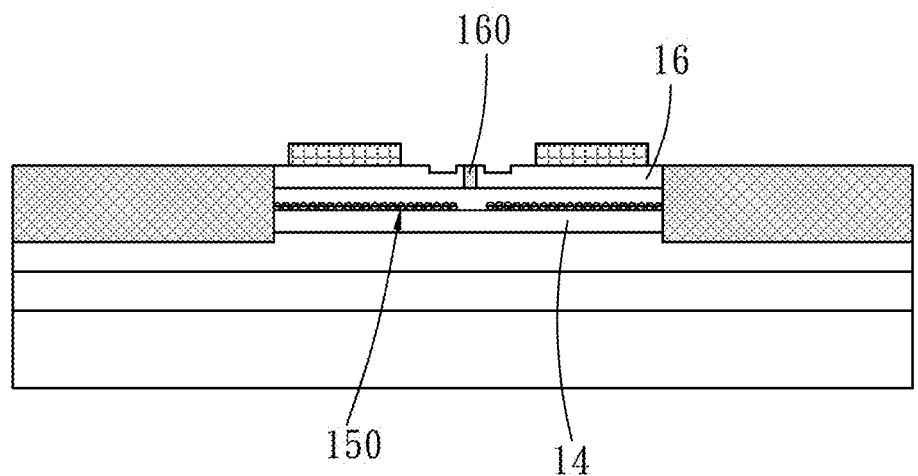
Figures 2, 3C:
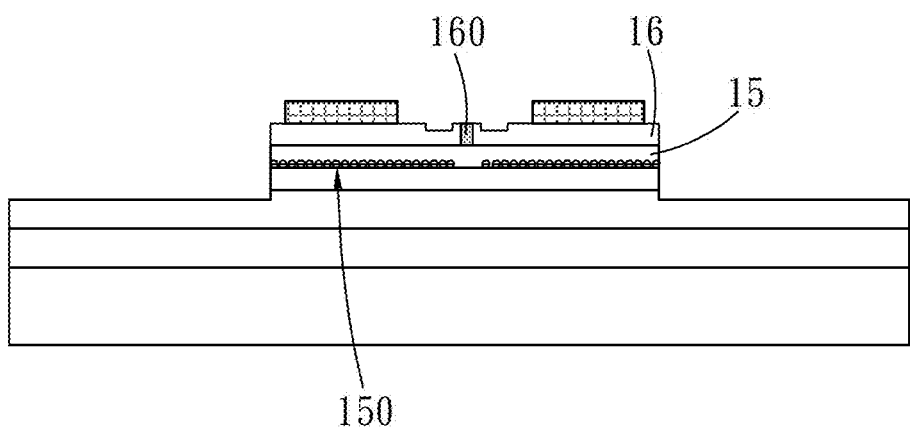

Please refer to FIG. 3C-1, which shows a schematic diagram of forming the fluorine-ion structure on the structure shown in FIG. 3B-1. Step S13: Implant fluorine ions. In this step, F- are implanted into the i-Al$_x$GaN layer 16 (x=0.1~0.3) below the location to form the first gate electrode 60 (as shown in FIG. 4E-1) such that the 2DEG 150 cannot be formed in the i-GaN channel layer 15 below F-implanted region. Then, after a 425° C. thermal treatment for 600 seconds, the fluorine-ion structure 160 will occupy stably the space inside the i-Al$_x$GaN layer 16.

Moreover, the fluorine ion implantation process further includes defining the region for implanting fluorine ions into the i-Al$_x$GaN layer 16 using photolithography. The fluorine-ion plasma is generated in the dry etching system or the ion implantation system using $CF_4$. Under a specific electric field (or a specific voltage), the fluorine ions are implanted into the i-Al$_x$GaN layer 16 (x=0.1~0.3). Afterwards, after a 425° C. thermal treatment for 600 seconds, the fluorine-ion structure 160 will occupy stably the space inside the i-Al$_x$-GaN layer 16. Besides, FIG. 3C-2 shows a schematic diagram of forming the fluorine-ion structure on the structure shown in FIG. 3B-2. It is the same as FIG. 3C-1. Hence, the details will not be described again.

Figures 1, 3D:
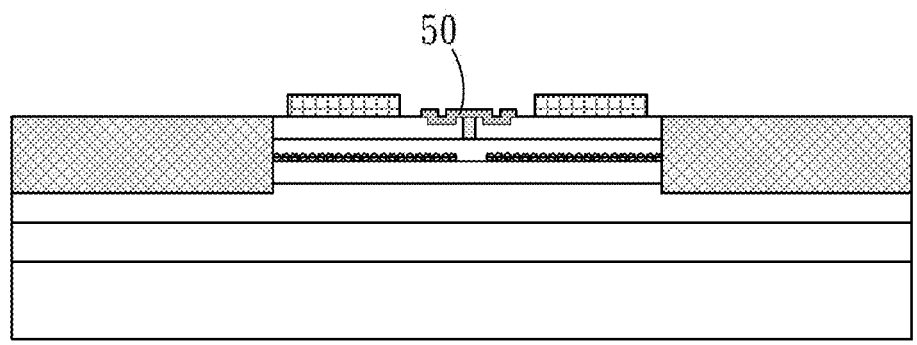
Figures 2, 3D:
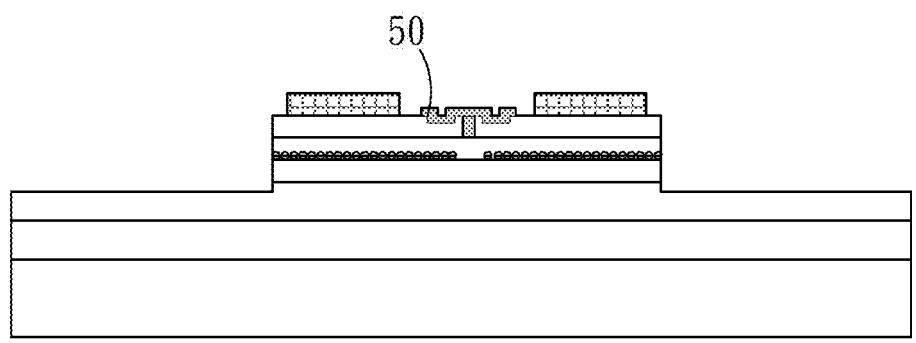

Please refer to FIG. 3D-1 shows a schematic diagram of forming the first gate dielectric layer on the structure shown in FIG. 3C-1. Step S14: Form the gate dielectric layer. In this step, PECVD is adopted for depositing a dielectric layer for forming the first gate dielectric layer 50. The material is selected from the group consisting of SiOx, SiO$_x$Ny, or SiN$_x$; the thickness is 10-100 nm. Next, the photoresist is used for defining the region of the first gate dielectric layer 50 by exposure and development. Finally, dry etching using buffered oxide etchant (BOE) is adopted for removing the dielectric layer outside the region of the first gate dielectric layer 50; only the region for forming the first gate dielectric layer 50 is reserved. Afterwards, the photoresist is removed by using photoresist stripper. In addition, FIG. 3D-2 shows a schematic diagram of forming the first gate dielectric layer on the structure shown in FIG. 3C-2. It is the same as FIG. 3D-1. Hence, the details will not be described again.

Figures 1, 3E:
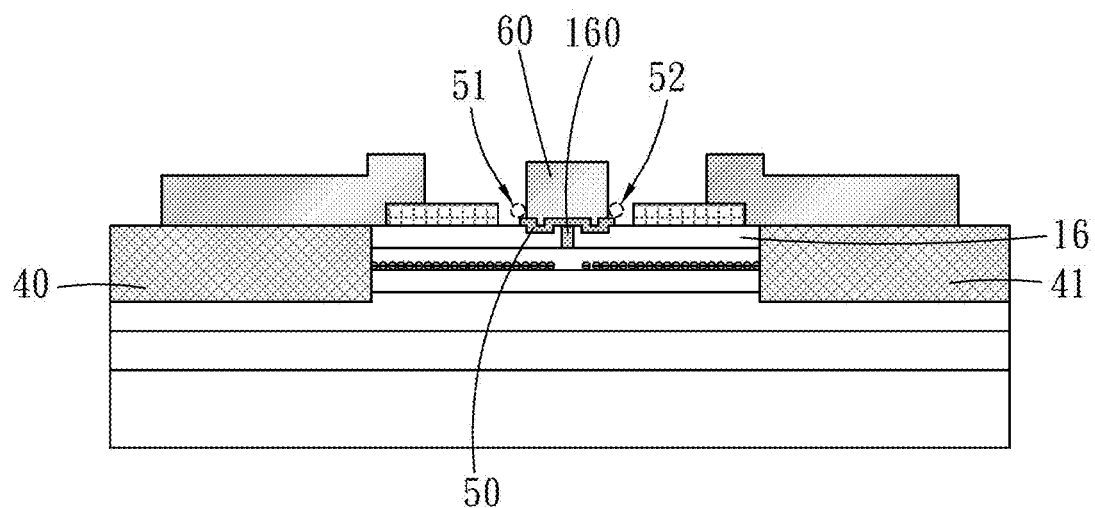
Figures 2, 3E:
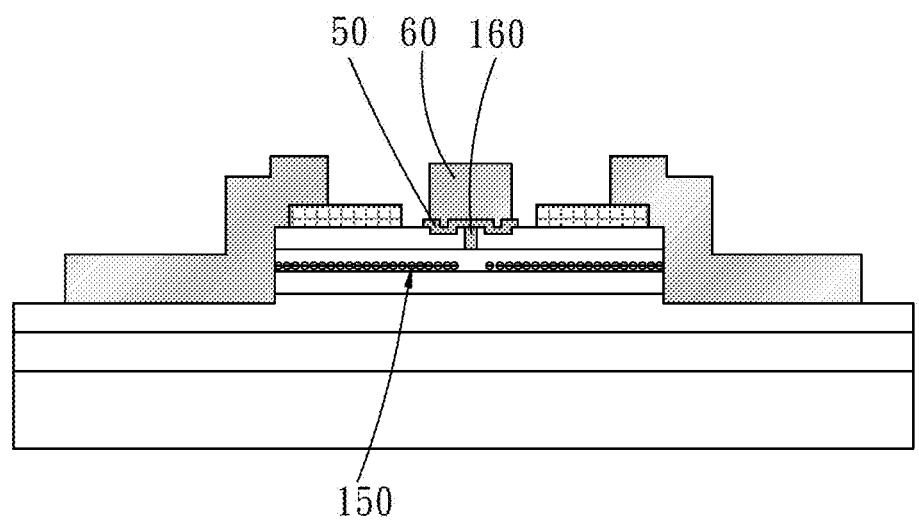

Please refer to FIG. 3E-1, which shows a schematic diagram of forming the first gate electrode, the source metal interconnect, and the drain metal interconnect on the structure shown in FIG. 3D-1. Step S15: Perform metal interconnect. This step includes performing metal coating. By combing metal vapor deposition and metal lift-off method, the Ni/Au metal layer is patterned to form a first gate electrode 60, the gate metal interconnect 601 (including forming the first gate bonding pad 80 shown in FIG. 2C), the source metal interconnect 61 (including the source bonding pad 82), and the drain metal interconnect 62 (including the drain bonding pad 83). For metal circuit layout, for example, the first gate electrode 60 on the fluorine-ion structure 160 and the first gate dielectric layer 50 is connected with the first gate bonding pad 80. In addition, FIG. 3E-2 shows a schematic diagram of forming the first gate electrode, the source metal interconnect, and the drain metal interconnect on the structure shown in FIG. 3D-2. It is the same as FIG. 3E-1. Hence, the details will not be described again.

Next, step S16: Deposit and pattern the dielectric layer. In this step, PECVD is adopted for depositing a passivation dielectric layer 70. The material is selected from the group consisting of SiO$_x$, SiO$_x$N$_y$, or SiN$_x$; the thickness is greater than 2000 A. This passivation dielectric layer 70 should be thick enough before it can generate enough stress on devices and altering their polarity. Finally, pattern the passivation dielectric layer 70 for exposing the bonding pads 82, 83 (as well as exposing the first gate bonding pad 80 shown in FIG. 2C). For example, dry etching using BOE can expose the bonding pads for future wiring. After this step, the fluorine-ion-implanted E-mode N-face AlGaN/GaN HEMT with polarity inversion shown in FIGS. 2A and 2B can be formed.

Furthermore, the dashed circles labeled in FIGS. 3E-1 and 3E-2 will form fringe capacitors 51, 52, which will result in the field plate effect. The main function of the field plate effect is to distribute the high-density electric field below the first gate electrode 60. In addition to increasing the breakdown voltage Vds between the drain and the source of the HEMT, it also suppresses the electron trapping effect below the first gate electrode 60 and hence reducing current collapse during the operation of the HEMT.

Figure 5A:
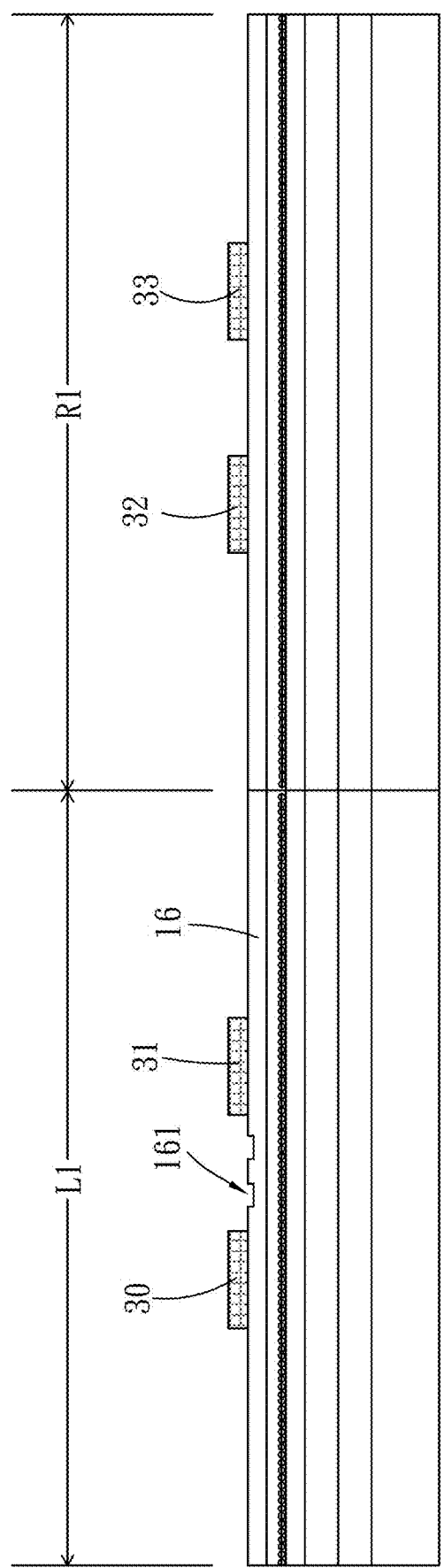
FIG. 5A shows a schematic diagram of forming the gate moat structure, the source ohmic-contact electrode, and the drain ohmic-contact electrode on the epitaxial structure of N-face AlGaN/GaN according to the present invention.
Figures 1, 5B:
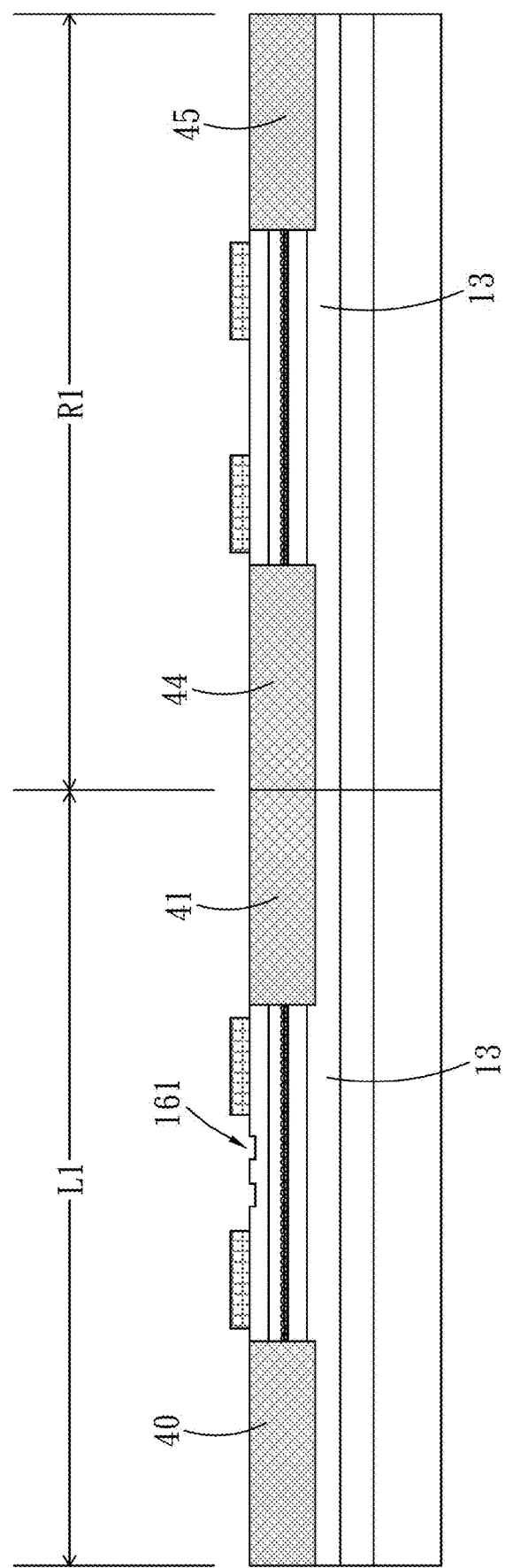
Figures 2, 5B:
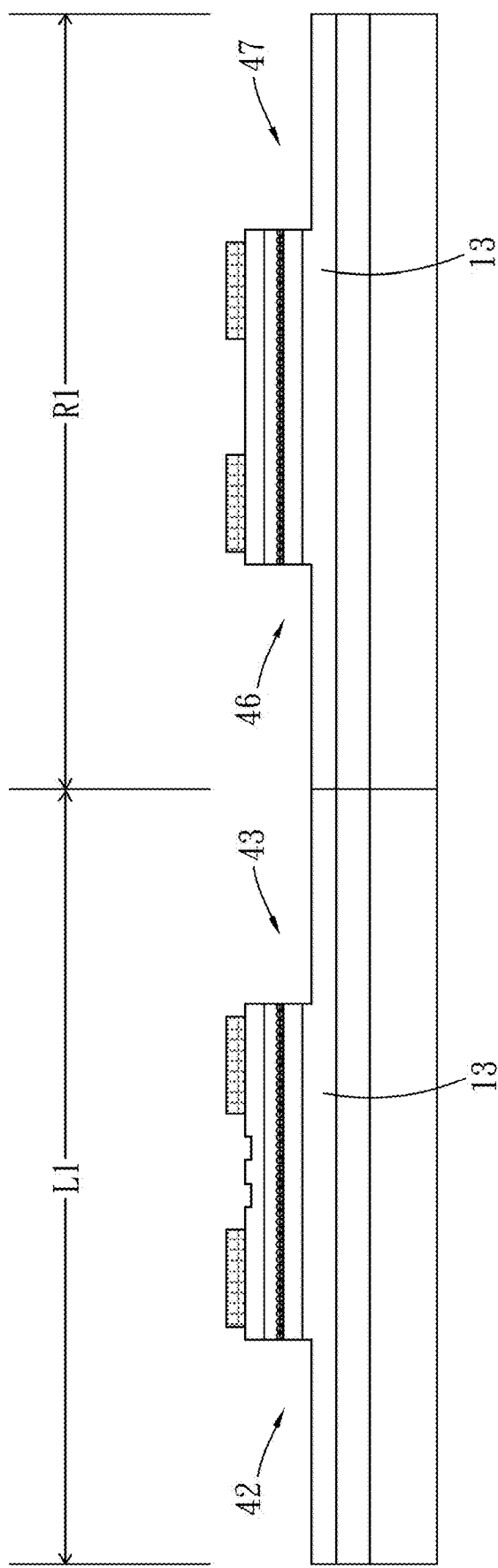

The second embodiment: FIG. 5A and FIG. 5B show a first and a second structure diagram of a hybrid E-mode N-face AlGaN/GaN HEMT with polarity inversion formed by cascoding an E-mode N-face AlGaN/GaN HEMT with polarity inversion and gate moat structure and a D-mode N-face AlGaN/GaN HEMT with polarity inversion and without gate dielectric layer according to the present invention. As shown in the figures, the dry etching method is adopted for etching the two gate moat structures 161 on the i-Al$_x$GaN layer 16 on both sides of the predetermined location for the fluorine-ion structure 160. Next, fluorine ions are implanted into the i-AlxGaN layer 16 below the first gate electrode 60 to form a hybrid E-mode N-face AlGaN/GaN HEMT with polarity inversion formed by cascoding an E-mode N-face AlGaN/GaN HEMT with polarity inversion and gate moat structure and a D-mode N-face AlGaN/GaN HEMT with polarity inversion and without gate dielectric layer.

The hybrid E-mode AlGaN/GaN HEMT according to the present invention can solve the problem occurring frequently in general E-mode AlGaN/GaN HEMTs. The problem is that the conduction current Ids will increase as the drain-to-source voltage increases when the device is operated in the saturation region (with the gate voltage Vgs fixed). The main reason is because the whole channel in the i-GaN channel layer 15 is not pinched off in the depletion region. Thereby, by cascoding a D-mode HEMT, the problem can be solved because the saturation current of the D-mode HEMT can be used to limit the saturation current of the E-mode HEMT.

Figure 4A:
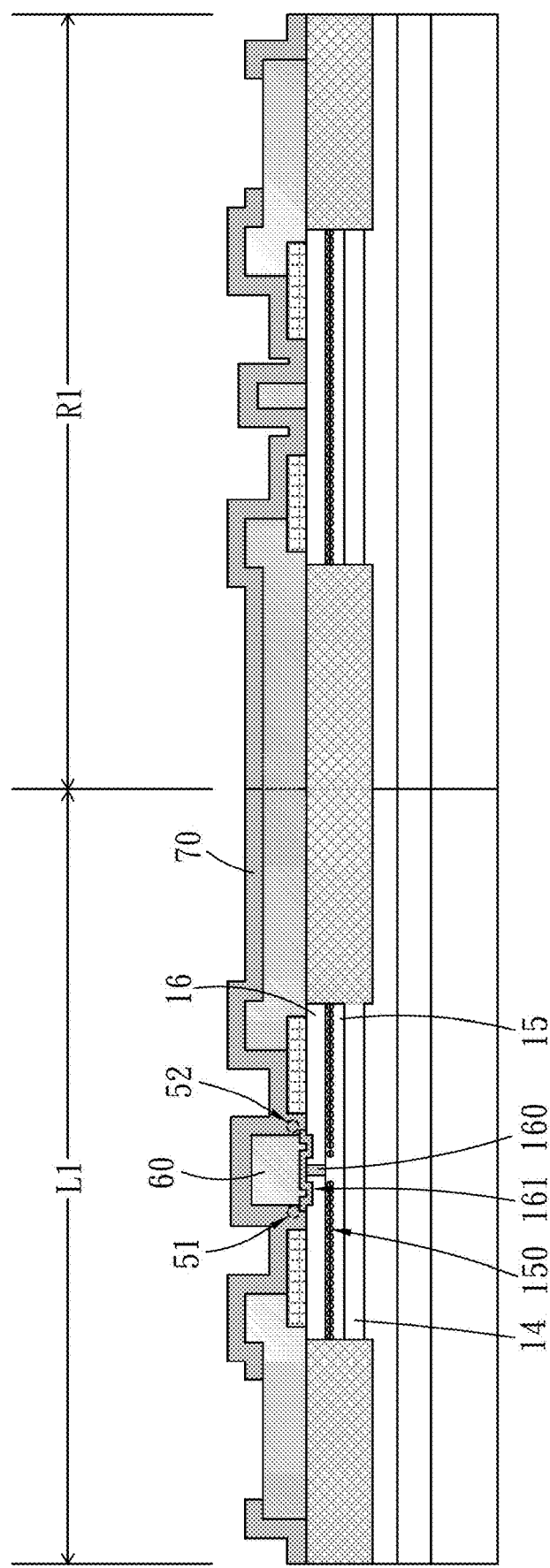
FIG. 4A shows a first structure diagram of a hybrid E-mode N-face AlGaN/GaN HEMT with polarity inversion formed by cascoding an E-mode N-face AlGaN/GaN HEMT with polarity inversion and gate moat structure and a D-mode N-face AlGaN/GaN HEMT with polarity inversion and without gate dielectric layer according to the present invention.
Figure 4B:
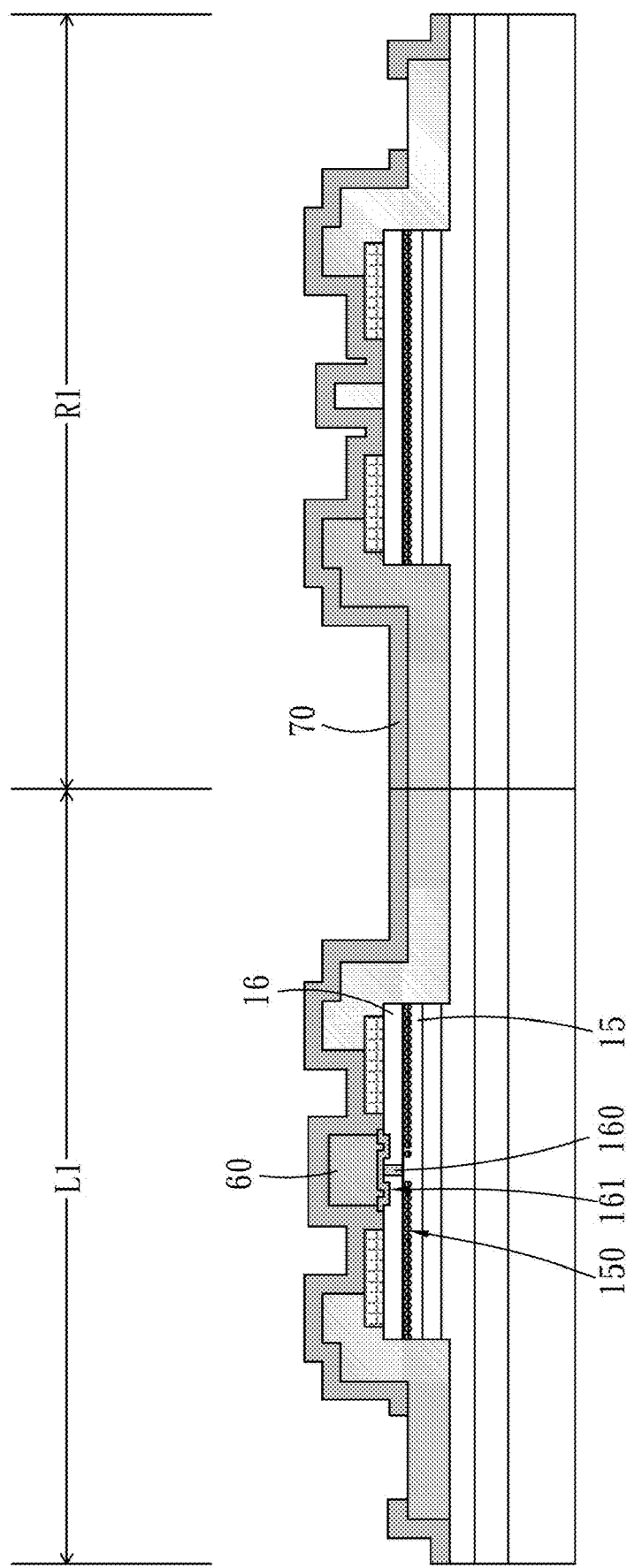
FIG. 4B shows a second structure diagram of a hybrid E-mode N-face AlGaN/GaN HEMT with polarity inversion formed by cascoding an E-mode N-face AlGaN/GaN HEMT with polarity inversion and gate moat structure and a D-mode N-face AlGaN/GaN HEMT with polarity inversion and without gate dielectric layer according to the present invention.

As shown in FIGS. 4A and 4B, the hybrid E-mode AlGaN/GaN HEMT with polarity inversion and gate moat structure according to the second embodiment includes the device structure of the epitaxial structure of N-face AlGaN/GaN with polarity inversion according to the present invention. The device structure is divided into a left region L1 and a right region R1. The left region L1 includes an E-mode AlGaN/GaN HEMT with polarity inversion of GaN and gate moat structure, which includes a fluorine-ion structure 160. Although the 2DEG 150 is formed in the i-GaN channel layer 15 at the junction of i-Al$_x$GaN layer 16/i-GaN channel layer 15, thanks to the existence of the fluorine-ion structure 160, the 2DEG 150 in the i-GaN channel layer 15 below the fluorine-ion structure 160 is depleted. The right region R1 includes a D-mode N-face AlGaN/GaN HEMT with polarity inversion and without gate dielectric layer.

Figure 4C:
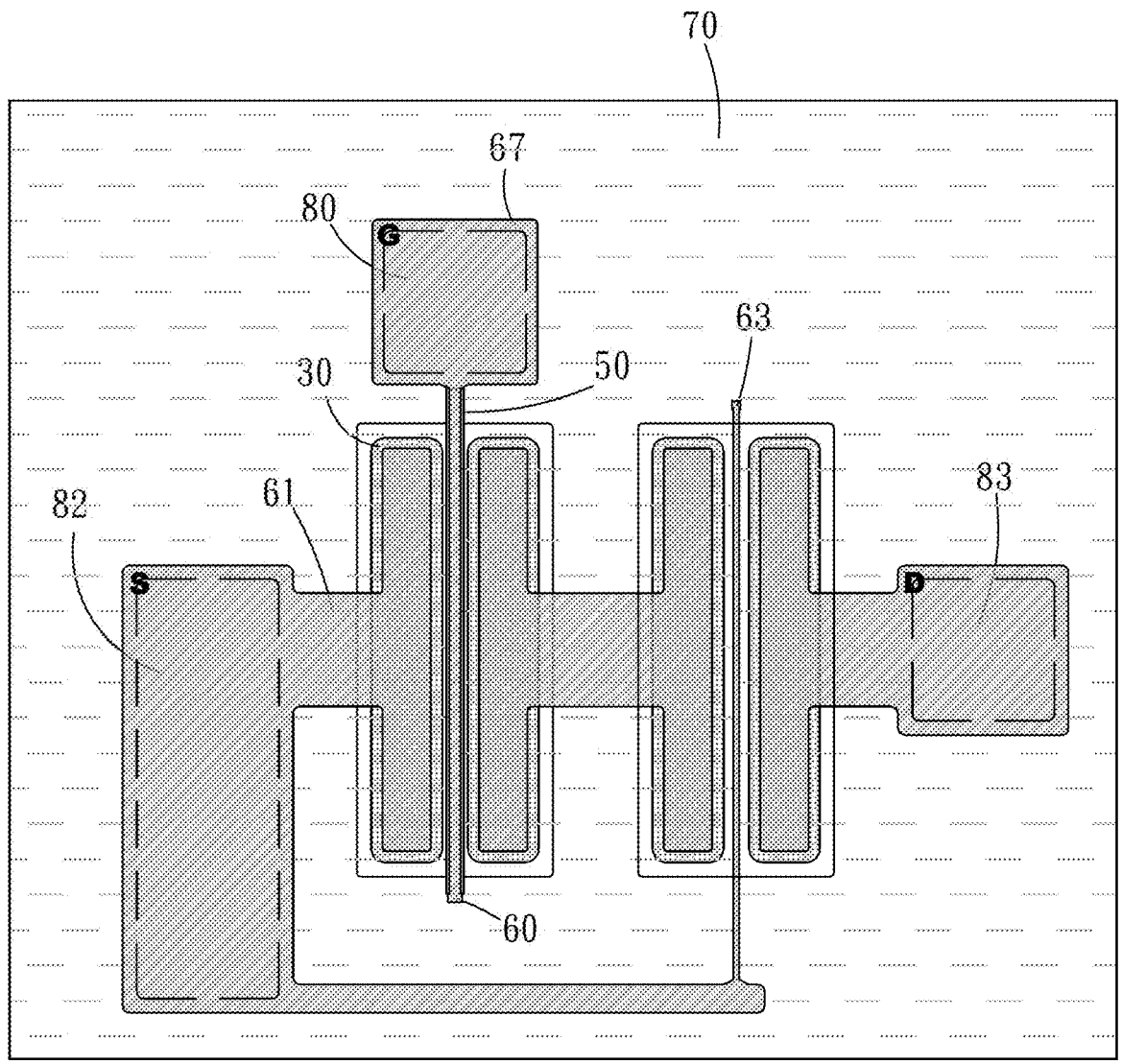
FIG. 4C shows a top view of a hybrid E-mode N-face AlGaN/GaN HEMT with polarity inversion formed by cascoding an E-mode N-face AlGaN/GaN HEMT with polarity inversion and gate moat structure and a D-mode N-face AlGaN/GaN HEMT with polarity inversion and without gate dielectric layer according to the present invention.

Please refer to FIG. 4C, which shows a top view of a hybrid E-mode N-face AlGaN/GaN HEMT with polarity inversion formed by cascoding an E-mode N-face AlGaN/GaN HEMT with polarity inversion and gate moat structure and a D-mode N-face AlGaN/GaN HEMT with polarity inversion and without gate dielectric layer according to the present invention. As shown in the figure, the source metal interconnect 61 is formed on the first source electrode 30 of the E-mode N-face AlGaN/GaN HEMT with polarity inversion of GaN and gate moat structure. The first source electrode 30 is connected to the second gate electrode 63 of the D-mode N-face AlGaN/GaN HEMT with polarity inversion and without gate dielectric layer via the source metal interconnect 61. In addition, the first drain metal interconnect and the second source metal interconnect are connected electrically. In the hybrid E-mode N-face AlGaN/GaN HEMT with polarity inversion, the S in FIG. 4C is a source; the G is a gate; and the D is a drain.

The fabrication process according to the present embodiment will be described as follows. FIG. 5A shows a schematic diagram of forming the source ohmic-contact electrode and the drain ohmic-contact electrode on the epitaxial structure of N-face AlGaN/GaN according to the present invention. First, an epitaxial structure of N-face AlGaN/GaN according to the present invention is provided. The left region L1 is set to fabricate the E-mode N-face AlGaN/GaN HEMT with polarity inversion of GaN and gate moat structure, while the right region R1 is set to fabricate the D-mode N-face AlGaN/GaN HEMT with polarity inversion and without gate dielectric layer. Nonetheless, the settings for the left and right regions L1, R1 can be altered undoubtedly according to requirements.

Next, as the step S11 described above, form the first source electrode 30, the first drain electrode 31, the second source electrode 32, and the second drain electrode 33. Then, after a 700~900° C. thermal treatment for 30 seconds, the first source electrode 30, the first drain electrode 31, the second source electrode 32, and the second drain electrode 33 become the first source ohmic-contact electrode 30, the first drain ohmic-contact electrode 31, the second source ohmic-contact electrode 32, and the second drain ohmic-contact electrode 33. Afterwards, the dry etching method is adopted for etching the two gate moat structures 161 on the i-Al$_x$GaN layer 16 on both sides of the predetermined location for fluorine-ion structure 160, as shown in FIG. 4B.

Please refer to FIG. 5B-1, which shows a schematic diagram of the device isolation process according to the first embodiment of the present invention. The isolation process between the device (transistor) in the left region L1 and the device (transistor) in the right region R1 is performed by using the destructive ion implantation 40, 41, 44, 45 shown in FIG. 5B-1 or the dry etching of the epitaxial structure 42, 43, 46, 47 of the N-face AlGaN/GaN shown in FIG. 5B-2 to the highly resistive C-doped GaN layer 13. Besides, FIG. 5B-2 shows a schematic diagram of the device isolation process according to the second embodiment of the present invention. This is similar to FIG. 5B-1. Hence, the details will not be described again.

Figures 1, 5C:
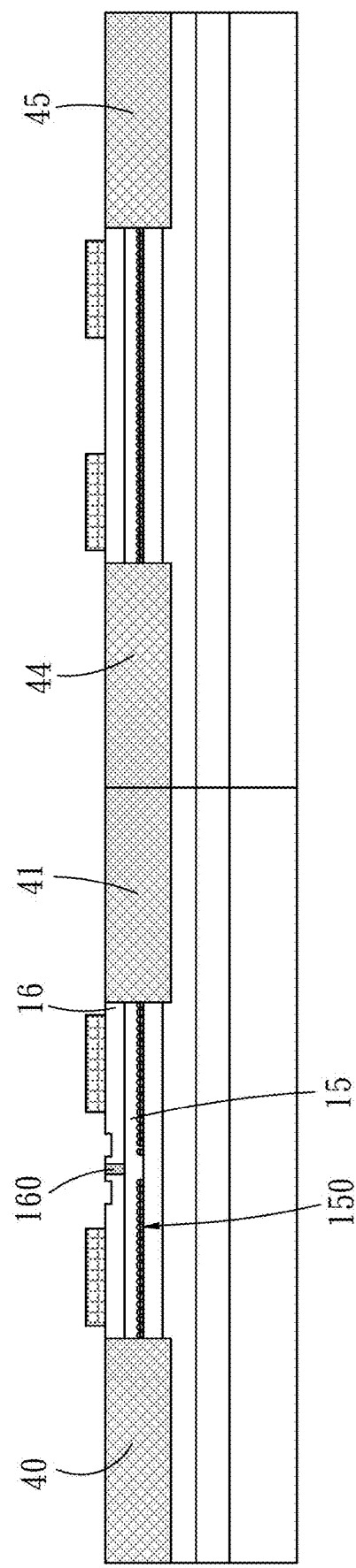
Figures 2, 5C:
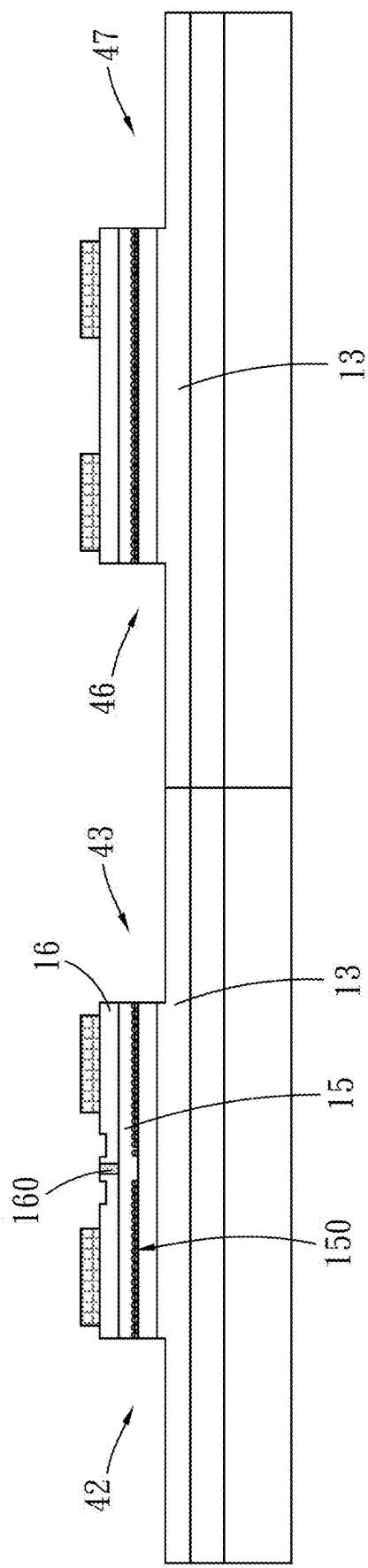

Please refer to FIG. 5C-1, which shows a schematic diagram of forming the fluorine-ion structure on the structure shown in FIG. 5B-1. As shown in the figure, F- are implanted into the i-Al$_x$GaN layer 16 (x=0.1~0.3) below the location to form the first gate electrode 60, as shown in FIG. 4B, such that the 2DEG 150 cannot be formed in the i-GaN channel layer 15 therebelow. Then, after a 425° C. thermal treatment for 600 seconds, the fluorine-ion structure 160 will occupy stably the space inside the i-Al$_x$GaN layer 16. Besides, FIG. 5C-2 shows a schematic diagram of forming the fluorine-ion structure on the structure shown in FIG. 5B-2. This is similar to FIG. 5C-1. Hence, the details will not be described again.

Figures 1, 5D:
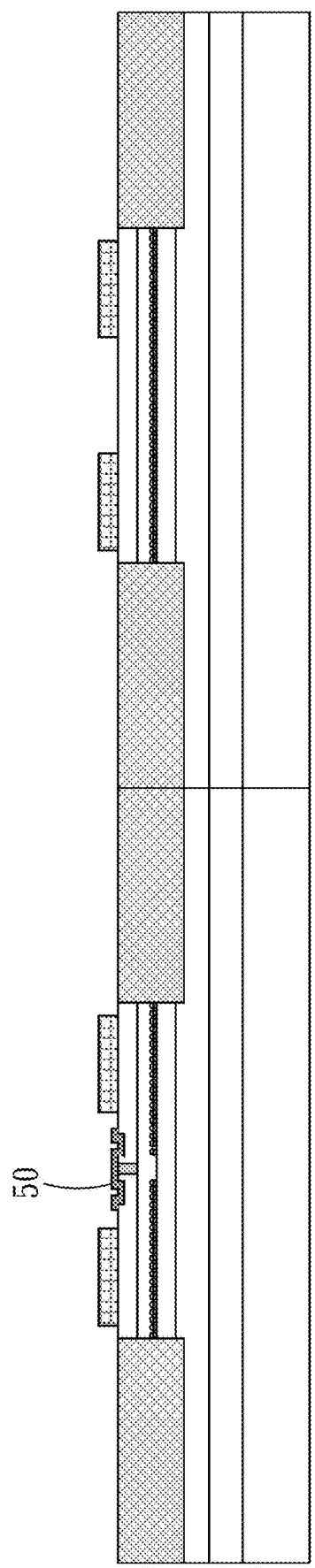
Figures 2, 5D:
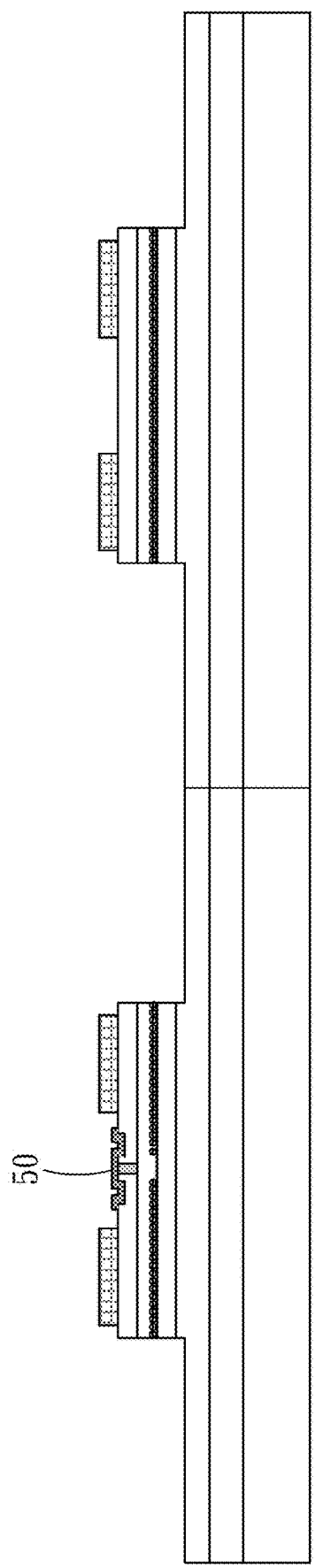

Please refer to FIG. 5D-1, which shows a schematic diagram of forming the gate dielectric layer 50 layer on the structure shown in FIG. 5C-1. As shown in the figure, PECVD is adopted for depositing a dielectric layer for forming the first gate dielectric layer 50. The material is selected from the group consisting of SiO$_x$, SiO$_x$N$_y$, or SiN$_x$; the thickness is 10~100 nm. Next, the photoresist is used for defining the region of the first gate dielectric layer 50 by exposure and development. Finally, dry etching using BOE is adopted for removing the dielectric layer outside the region of the first gate dielectric layer 50; only the region for forming the first gate dielectric layer 50 is reserved. Afterwards, the photoresist is removed by using photoresist stripper. In addition, FIG. 5D-2 shows a schematic diagram of forming the gate dielectric layer on the structure shown in FIG. 5C-2. It is similar to FIG. 5D-1. Hence, the details will not be described again.

Figures 1, 5E:
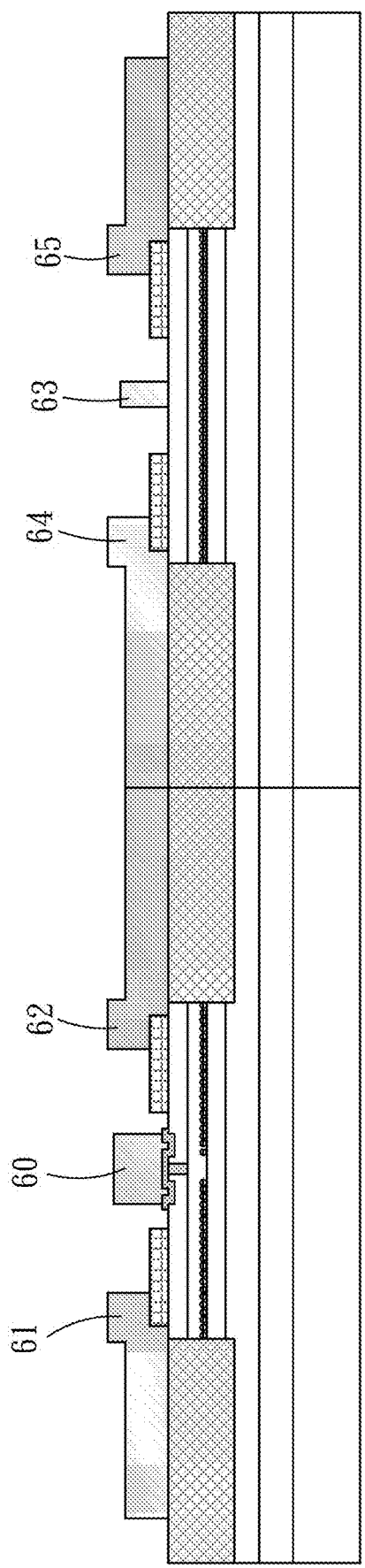
Figures 2, 5E:
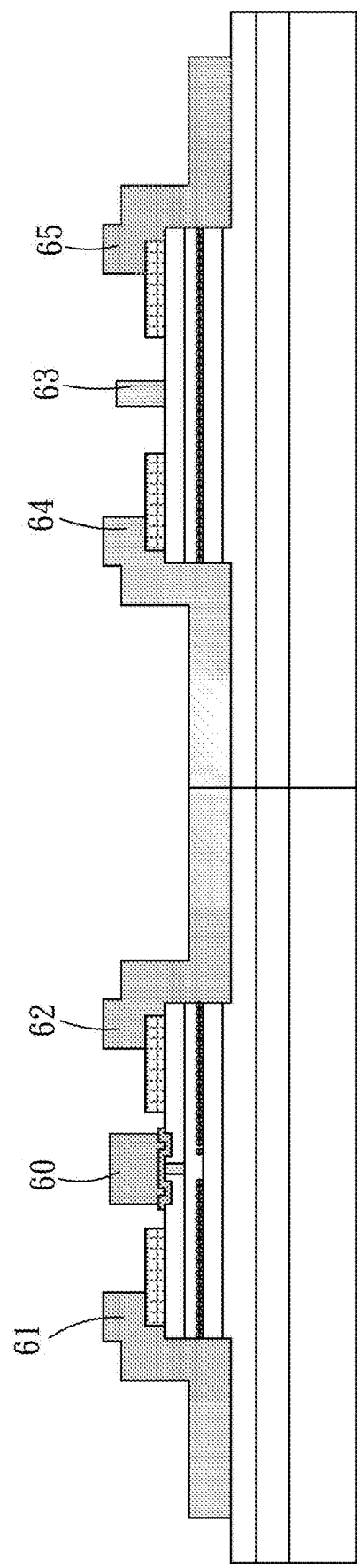

Please refer to FIG. 5E-1, which shows a schematic diagram of forming the gate electrode and the metal interconnect on the structure shown in FIG. 5D-1. As shown in the figure, by combing metal vapor deposition and metal lift-off method, the first gate electrode 60, the first source metal interconnect 61 (including the source bonding pad 82 as shown in FIG. 4C), the first drain metal interconnect 62, the second gate electrode 63, the second source metal interconnect 64, and the second drain metal interconnect 65 (including the drain bonding pad 83 as shown in FIG. 4C). Of course, in this step, the first gate metal interconnect 67 (including the first gate bonding pad 80 as shown in FIG. 4C) connected electrically with the first gate electrode 60 can be formed concurrently. Besides, the first gate electrode 60, the first source metal interconnect 61, the first drain metal interconnect 62, the second gate electrode 63, the second source metal interconnect 64, and the second drain metal interconnect 65 are formed by metal coating. The first source metal interconnect 61 and the second gate electrode 63 are connected electrically; the first drain metal interconnect 62 and the second source metal interconnect 64 are connected electrically. FIG. 5E-2 shows a schematic diagram of forming the gate electrode and the metal interconnect on the structure shown in FIG. 5D-2. It is similar to FIG. 5E-1. Hence, the details will not be described again.

Next, likewise, PECVD is adopted for depositing a passivation dielectric layer 70 with compressive stress (dielectric constant n~1.45) or with larger expansive tensile stress (dielectric constant n~2.0). The material is selected from the group consisting of SiO$_x$, SiO$_x$N$_y$, or SiN$_x$; the thickness is greater than 200 nm. Then the i-Al$_x$GaN layer 16/the i-GaN channel layer 15/the i-Al$_y$GaN layer 14 in the active region of the epitaxial layer will be inverted from the N-face polarity to the Ga-face polarity (polarity inversion), enabling the fluorine-ion structure 160 to deplete the 2DEG 150 easier. Finally, the passivation dielectric layer 70 is patterned to expose the bonding pads 80, 82, 83 in FIG. 5C and hence completing the structure of FIGS. 4A and 4B.

Furthermore, the dashed circles labeled in FIG. 4A will form fringe capacitors 51, 52, which will result in the field plate effect. The main function of the field plate effect is to distribute the high-density electric field below the first gate electrode 60. In addition to increasing the breakdown voltage Vds between the drain and the source of the HEMT, it also suppresses the electron trapping effect below the first gate electrode 60 and hence reducing current collapse during the operation of the HEMT.

Figures 1, 4D:
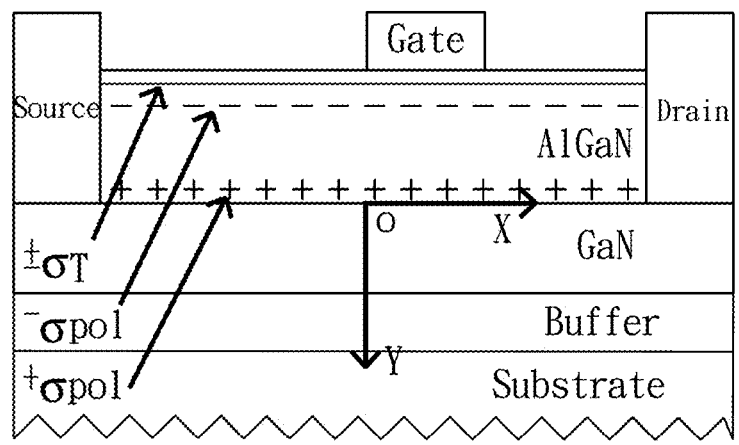
FIG. 4D shows an equivalent circuit diagram of a hybrid E-mode N-face AlGaN/GaN HEMT with polarity inversion formed by cascoding an E-mode N-face AlGaN/GaN HEMT with polarity inversion and gate moat structure and a D-mode N-face AlGaN/GaN HEMT with polarity inversion and without gate dielectric layer according to the present invention.
Figures 2, 4D:
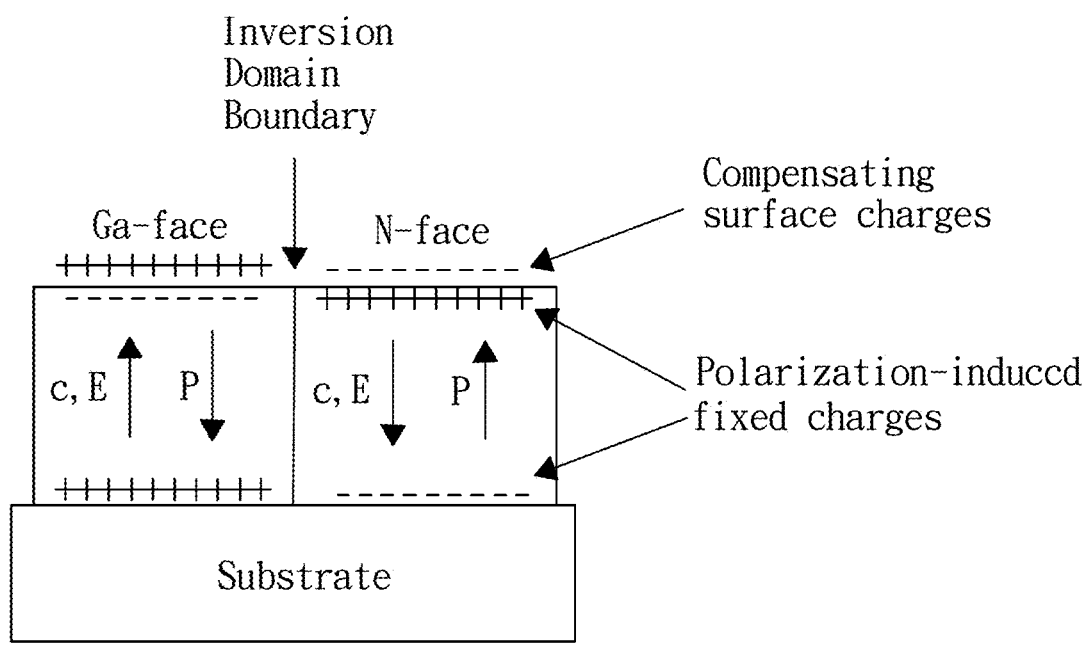

The structure shown in FIG. 4D-1 is a Ga-face HEMT structure according to the prior art. Owing to the downward polarization (spontaneous polarization) and the piezoelectric effect, positive charges $+\sigma_{pol}$ will accumulate at the bottom of AlGaN while negative charges $-\sigma_{pol}$ will accumulate at the top of AlGaN. In addition, $\sigma_T$ (donor-like surface traps) are just the so-called surface traps, which will capture electrons and result in current collapse.

According to the above description, as the passivation dielectric layer 70 in the N-face epitaxial structures 1, 2 according to the present invention becomes thicker, the compressive or expansive stress exerted downwards by the passivation dielectric layer 70 becomes greater. When the stress reaches a certain level, the i-Al$_x$GaN layer 16/the i-GaN channel layer 15/the i-Al$_y$GaN layer 14 in the active region of the epitaxial layer will be inverted from the N-face polarity to the Ga-face polarity. At this time, the 2DEG 150 in the i-GaN channel layer 15 at the junction of the i-GaN channel layer 15/the i-Al$_y$GaN layer 14 will be moved to the junction of the i-Al$_x$GaN layer 16/the i-GaN channel layer 15. The accompanying advantages include first, the surface traps in the N-face i-Al$_x$GaN layer 16 are fewer. Thereby, the few shallow traps formed previously can be used to release the electrons captured by the surface traps in extremely small current. Secondly, because the bandgap of the i-Al$_y$-GaN layer 14 is wider, it can be used to block the electrons of buffer traps from entering the i-GaN channel layer 15.

Moreover, please refer to FIG. 4D-2. The surface of the i-Al$_x$GaN layer 16 on the N-face epitaxy surface includes compensating negative charges. Thereby, when the passivation dielectric layer 70 (SiO$_x$ or SiN$_x$) starts to be deposited, due to the compensating negative charges on the surface of the i-Al$_x$GaN layer 16, the oxygen ions (O$^{2-}$) or nitrogen ions (N$^{3-}$) generated in the plasma will not bond with the compensating negative charges on the surface of i-Al$_x$GaN nor undergo surface reconstruction. On the contrary, micro traces of vacancies will be formed therebetween. This vacancy defects are shallow traps in nature, meaning that electrons can be captured and released with ease. Thereby, as the surface traps capture electrons, the electrons are easily grabbed by the vacancies. Then the electrons will escape from the surface of i-Al$_x$GaN by hopping between the vacancies. This method can solve the current collapse effect caused by the surface traps in the i-Al$_x$GaN layer 16.

Figure 6A:
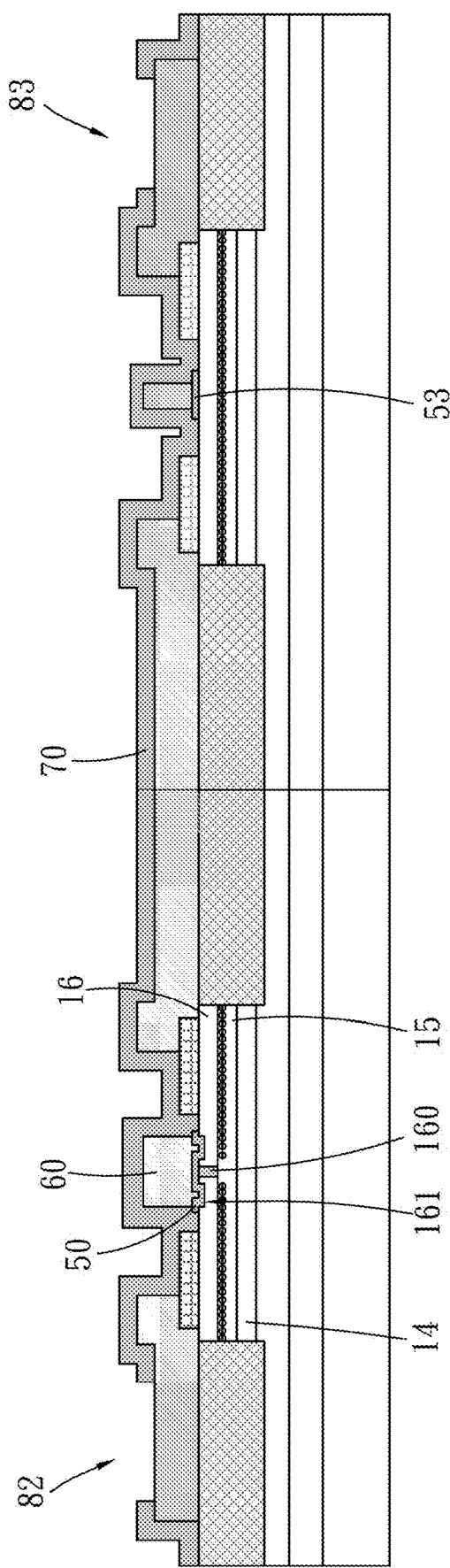
FIG. 6A shows a first structure diagram of a hybrid E-mode N-face AlGaN/GaN HEMT with polarity inversion formed by cascoding an E-mode N-face AlGaN/GaN HEMT with polarity inversion and gate moat structure and a D-mode N-face AlGaN/GaN HEMT with polarity inversion and gate dielectric layer according to the present invention.
Figure 6B:
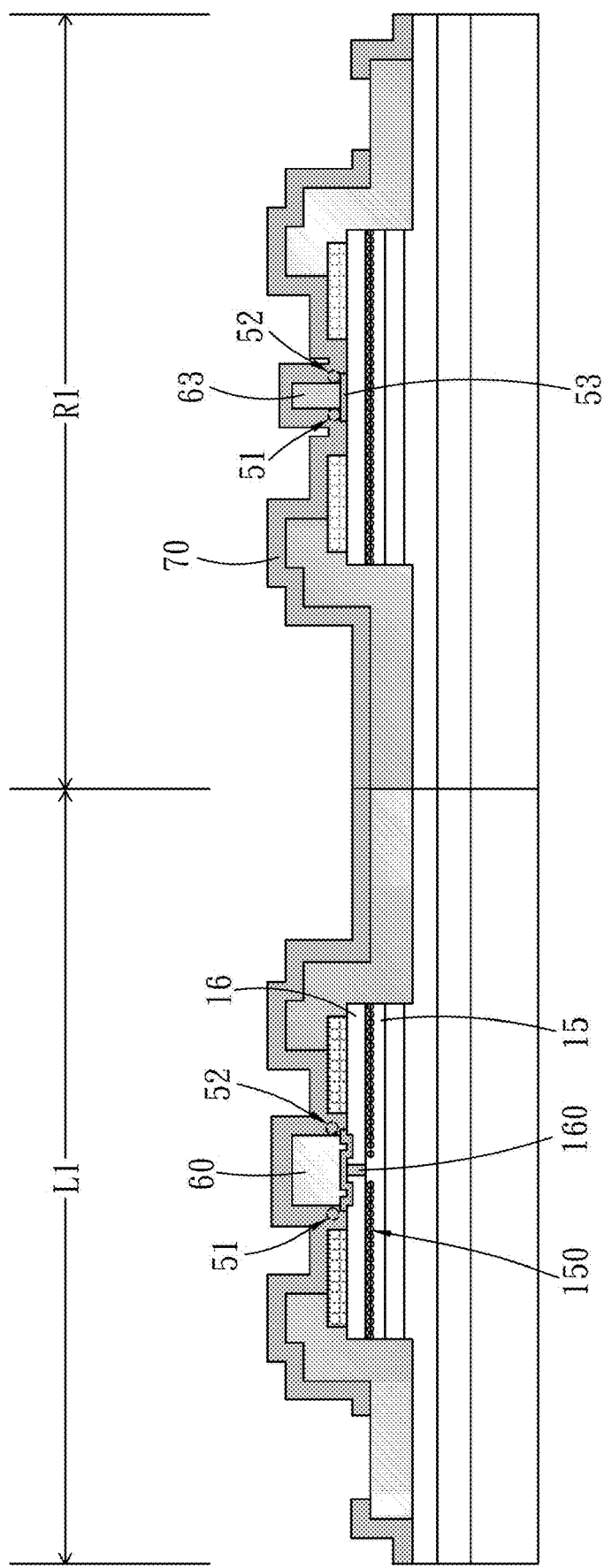
FIG. 6B shows a second structure diagram of a hybrid E-mode N-face AlGaN/GaN HEMT with polarity inversion and gate moat structure formed by cascoding an E-mode N-face AlGaN/GaN HEMT with polarity inversion and a D-mode N-face AlGaN/GaN HEMT with polarity inversion and gate dielectric layer according to the present invention.

Please refer to FIG. 6A and FIG. 6B, which show a first and a second structure diagram of a hybrid E-mode N-face AlGaN/GaN HEMT with polarity inversion formed by cascoding an E-mode N-face AlGaN/GaN HEMT with polarity inversion and gate moat structure and a D-mode N-face AlGaN/GaN HEMT with polarity inversion and gate dielectric layer according to the present invention. As shown in the figures, according to the third embodiment of the present invention, fluorine ions are implanted into the i-AlxGaN layer 16 (x=0.1~0.3) below the first gate electrode 60 to form a hybrid E-mode N-face AlGaN/GaN HEMT with polarity inversion formed by cascoding an E-mode N-face AlGaN/GaN HEMT with polarity inversion and gate moat structure and a D-mode N-face AlGaN/GaN HEMT with polarity inversion and gate dielectric layer 50.

As shown in FIGS. 6A and 6B, the hybrid E-mode AlGaN/GaN HEMT with polarity inversion according to the third embodiment includes the device structure of the epitaxial structure of N-face AlGaN/GaN according to the present invention. The device structure is divided into a left region L1 and a right region R1. The left region L1 includes an E-mode AlGaN/GaN HEMT with polarity inversion of GaN and gate moat structure, which includes a fluorine-ion structure 160. Although the 2DEG 150 is formed in the i-GaN channel layer 15 at the junction of i-AlxGaN layer 16/i-GaN channel layer 15, due to the existence of the fluorine-ion structure 160, the 2DEG 150 in the i-GaN channel layer 15 below the fluorine-ion structure 160 is depleted. The right region R1 includes a D-mode N-face AlGaN/GaN HEMT with polarity inversion and gate dielectric layer. The D-mode AlGaN/GaN HEMT includes a second gate dielectric layer 53.

Figure 6C:
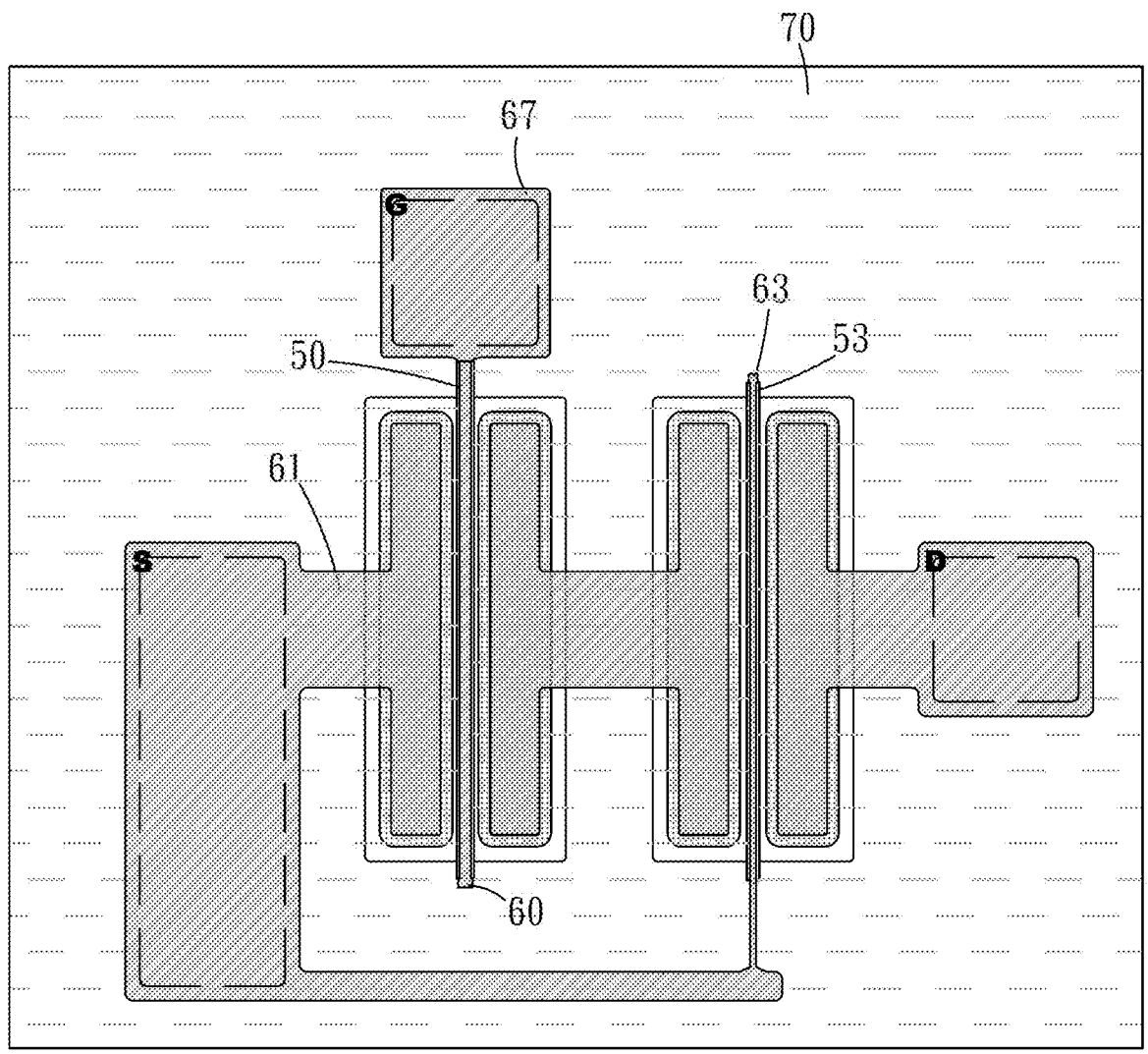
FIG. 6C shows a top view of a hybrid E-mode N-face AlGaN/GaN HEMT with polarity inversion and gate moat structure formed by cascoding an E-mode N-face AlGaN/GaN HEMT with polarity inversion and a D-mode N-face AlGaN/GaN HEMT with polarity inversion and gate dielectric layer according to the present invention.
Figure 6D:
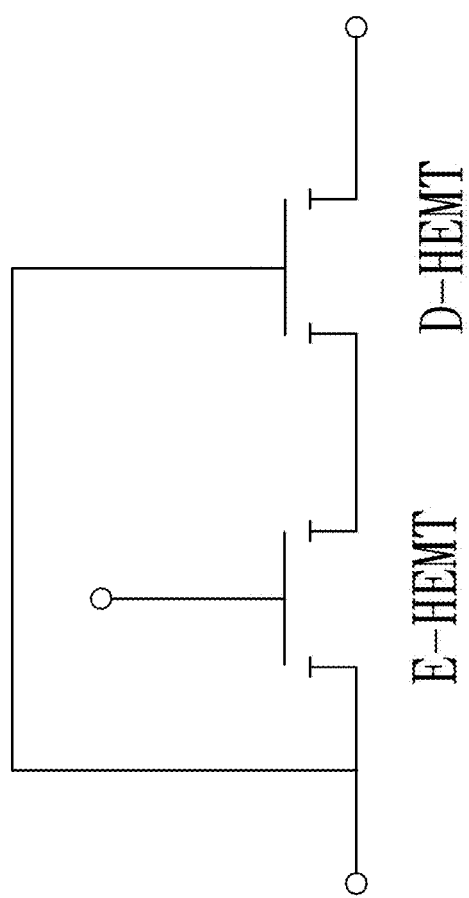
FIG. 6D shows an equivalent circuit diagram of a hybrid E-mode N-face AlGaN/GaN HEMT with polarity inversion and gate moat structure formed by cascoding an E-mode N-face AlGaN/GaN HEMT with polarity inversion and a D-mode N-face AlGaN/GaN HEMT with polarity inversion and gate dielectric layer according to the present invention.

Please refer to FIG. 6C, which shows a top view of a hybrid E-mode N-face AlGaN/GaN HEMT with polarity inversion and gate moat structure formed by cascoding an E-mode N-face AlGaN/GaN HEMT with polarity inversion and a D-mode N-face AlGaN/GaN HEMT with polarity inversion and gate dielectric layer according to the present invention. As shown in the figure, the D-mode N-face AlGaN/GaN HEMT with polarity inversion and gate dielectric layer includes the second gate dielectric layer 53. The rest are similar to FIG. 4C. Hence, the details will not be described again.

Figure 7A:
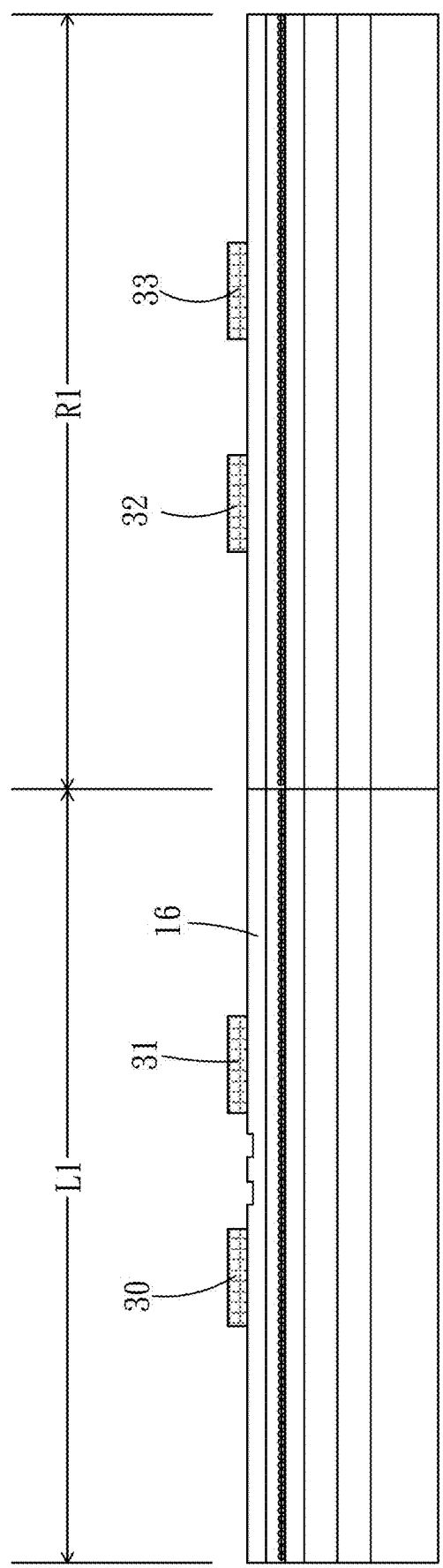
FIG. 7A shows a schematic diagram of forming the gate moat structure, the source ohmic-contact electrode and the drain ohmic-contact electrode on the epitaxial structure of N-face AlGaN/GaN according to the present invention.
Figures 1, 7A:
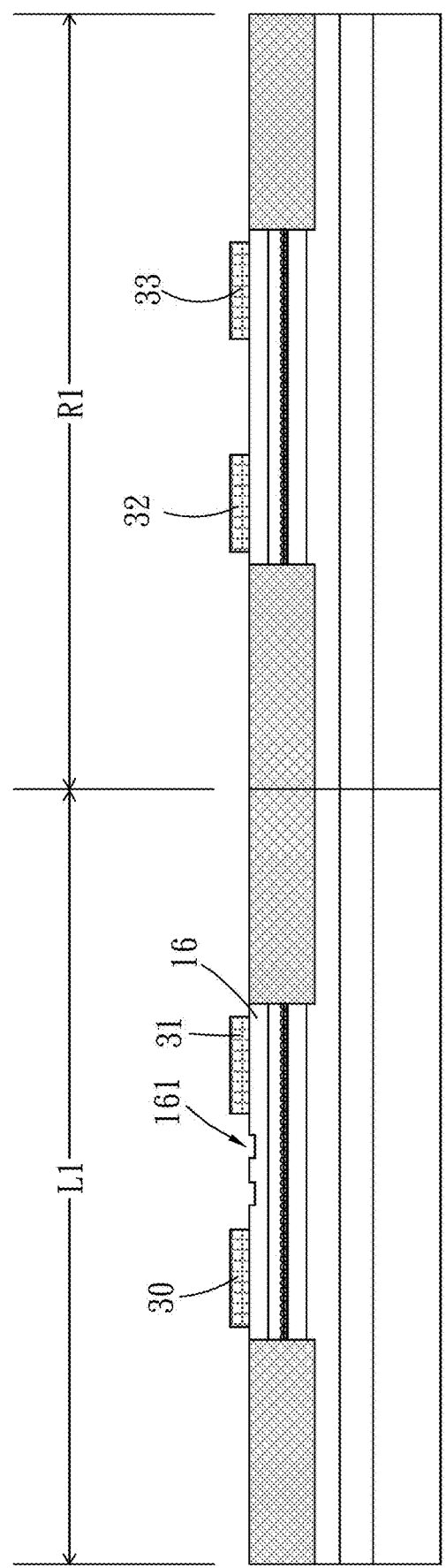
Figures 2, 7A:
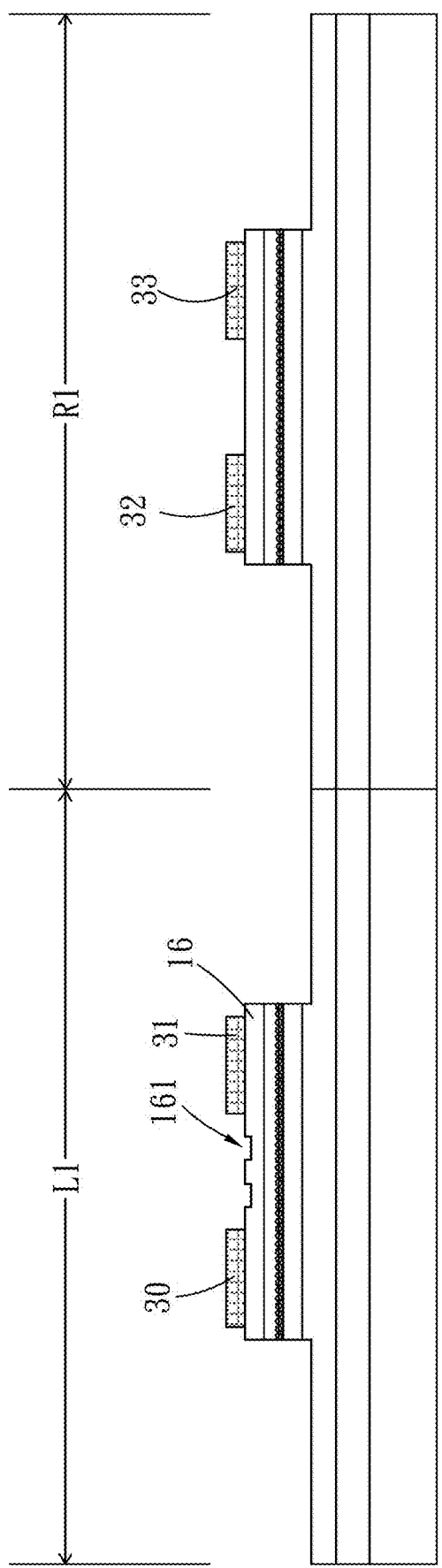

Please refer to FIG. 7A-1, which shows a schematic diagram of the device isolation process according to the first embodiment of the present invention. First, as the steps in the second embodiment, an epitaxial structure of N-face AlGaN/GaN according to the present invention is provided. The left region L1 is set to fabricate the E-mode N-face AlGaN/GaN HEMT with polarity inversion and gate moat structure, while the right region R1 is set to fabricate the D-mode N-face AlGaN/GaN HEMT with polarity inversion and gate dielectric layer. Next, as the fabrication method described above, the first source electrode 30, the first drain electrode 31, the second source electrode 32, and the second drain electrode 33 are formed on the epitaxial structure of N-face AlGaN/GaN. Afterwards, the device isolation process is performed. In addition, FIG. 7A-2 shows a schematic diagram of the device isolation process according to the second embodiment of the present invention. It is similar to FIG. 7A-1. Hence, the details will be not described again.

Figures 1, 7B:
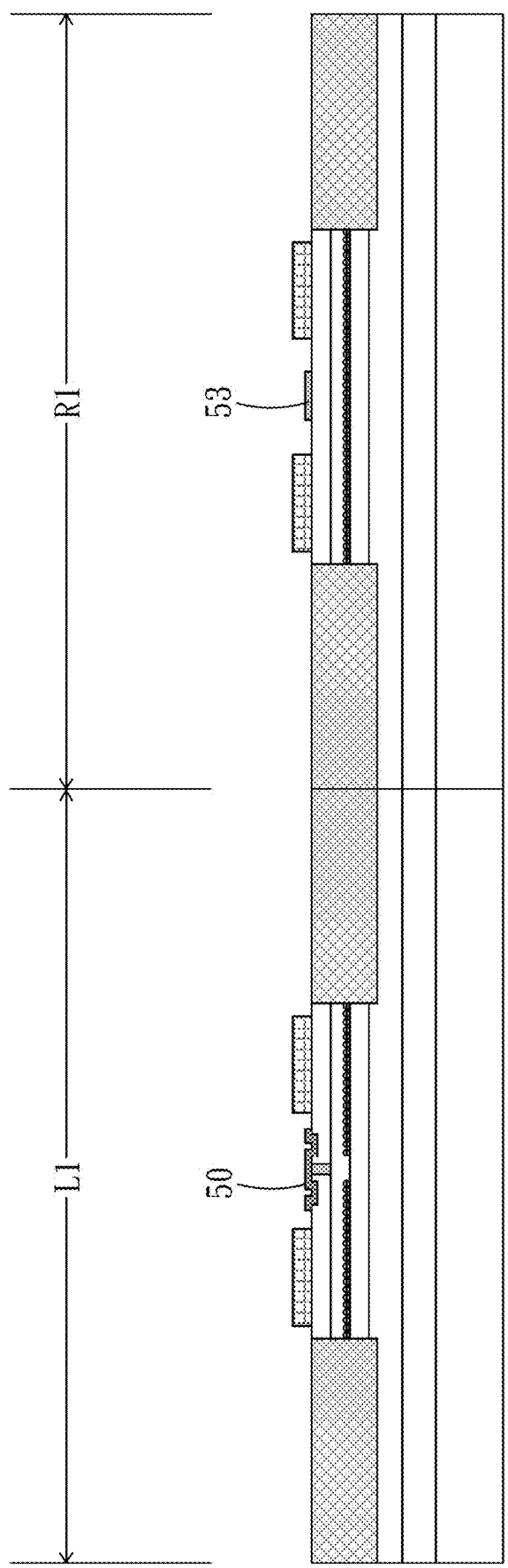
Figures 2, 7B:
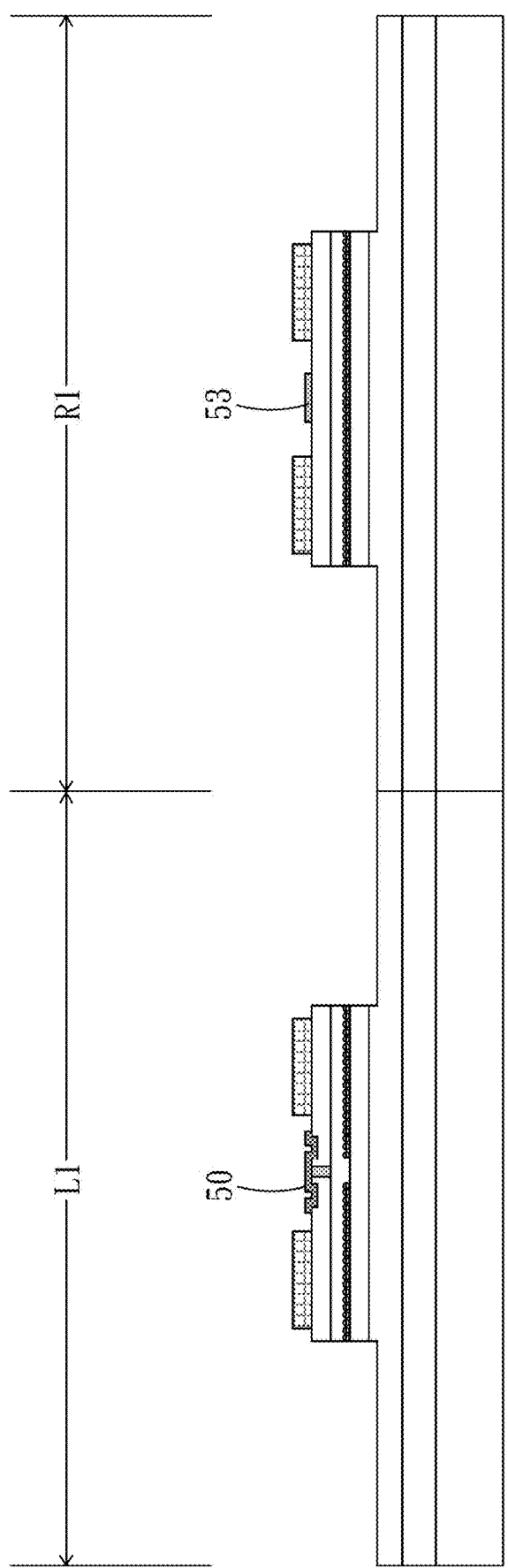
Figures 1, 8A:
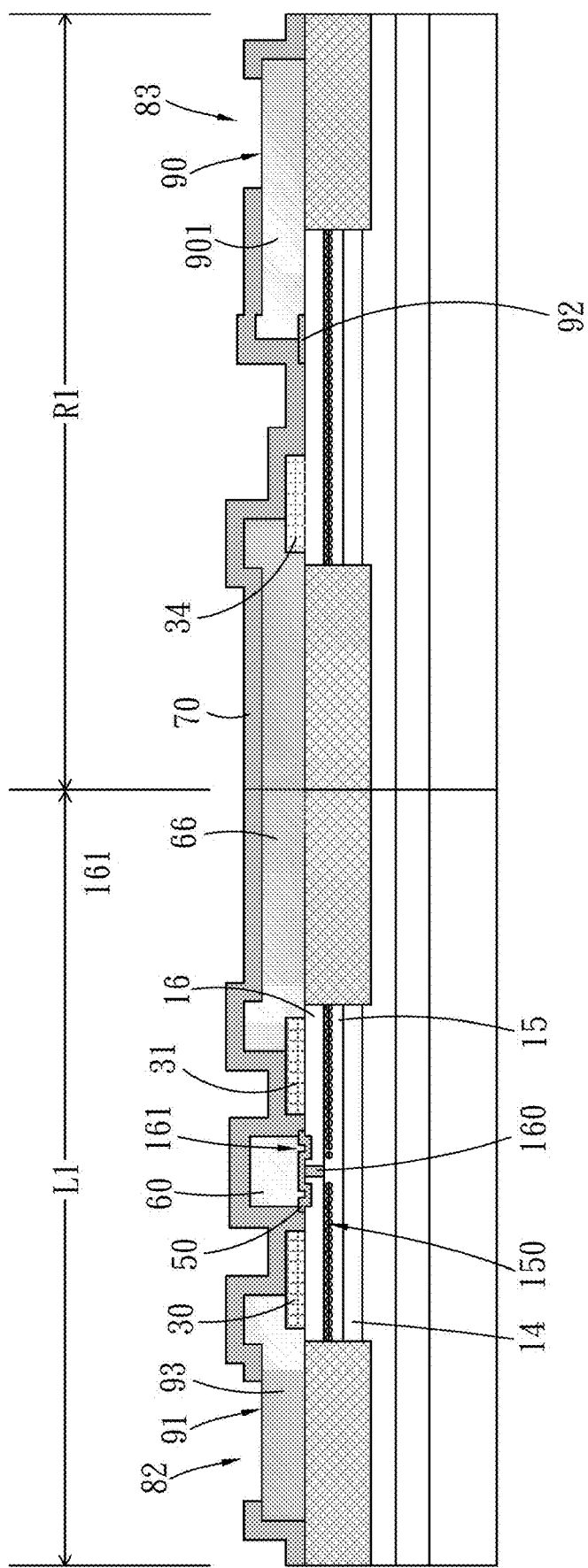
Figures 2, 8A:
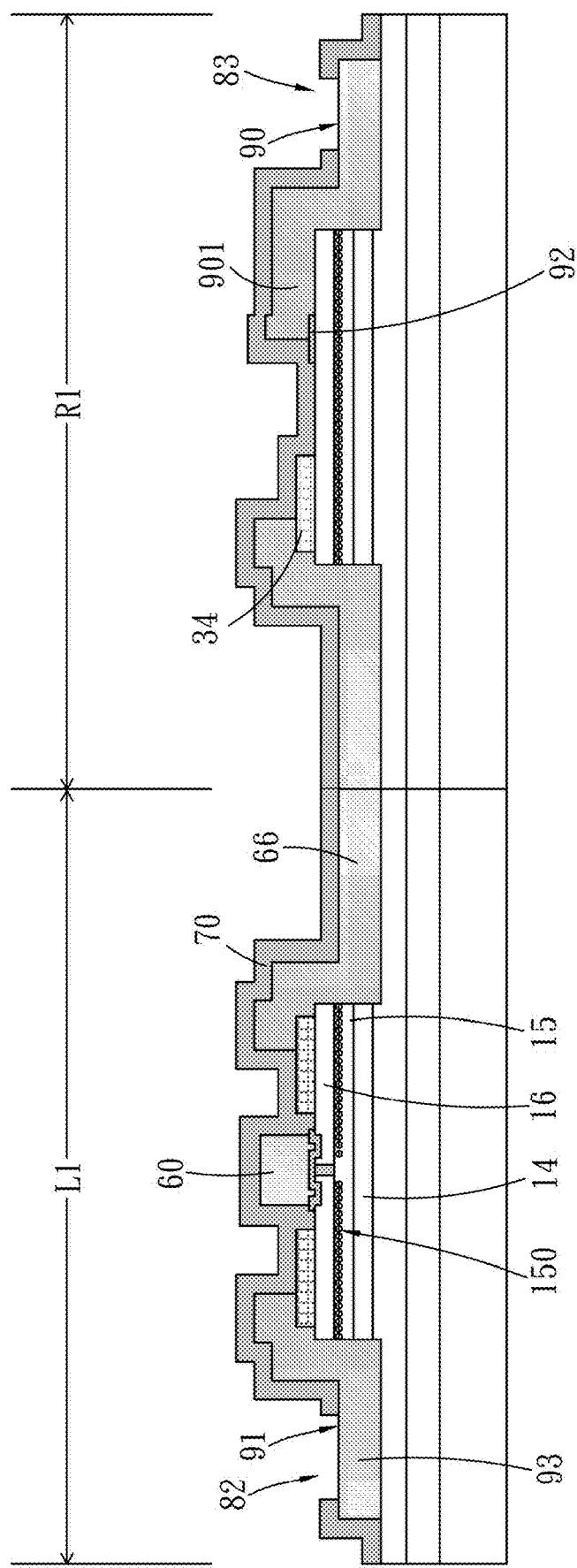

Please refer to FIG. 7B-1, which shows a schematic diagram of forming the fluorine-ion structure and the gate oxide layer on the structure shown in FIG. 8A-1 according to the present invention. Next, fabricate the first gate dielectric layer 50 in the left region L1 (the E-mode HEMT) and the second gate dielectric layer 53 in the right region R1 (the D-mode HEMT). The steps are illustrated as follows. PECVD is adopted for depositing a dielectric layer. The material is selected from the group consisting of SiO$_x$, SiO$_x$N$_y$, or SiN$_x$; the thickness is 10-100 nm. Next, the photoresist is used for defining the region of the first gate dielectric layer 50 and the region of the second gate dielectric layer 53 by exposure and development. Finally, dry etching using BOE is adopted for removing the dielectric layer outside the region of the first gate dielectric layer 50 and the region of the second gate dielectric layer 53; only the region for forming the first gate dielectric layer 50 and the region for forming the second gate dielectric layer 53 are reserved. Afterwards, the photoresist is removed by using photoresist stripper. In addition, FIG. 7B-2 shows a schematic diagram of forming the fluorine-ion structure and the gate oxide layer on the structure shown in FIG. 7A-2 according to the present invention. It is similar to FIG. 7B-1. Hence, the details will be not described again.

Figures 1, 7C:
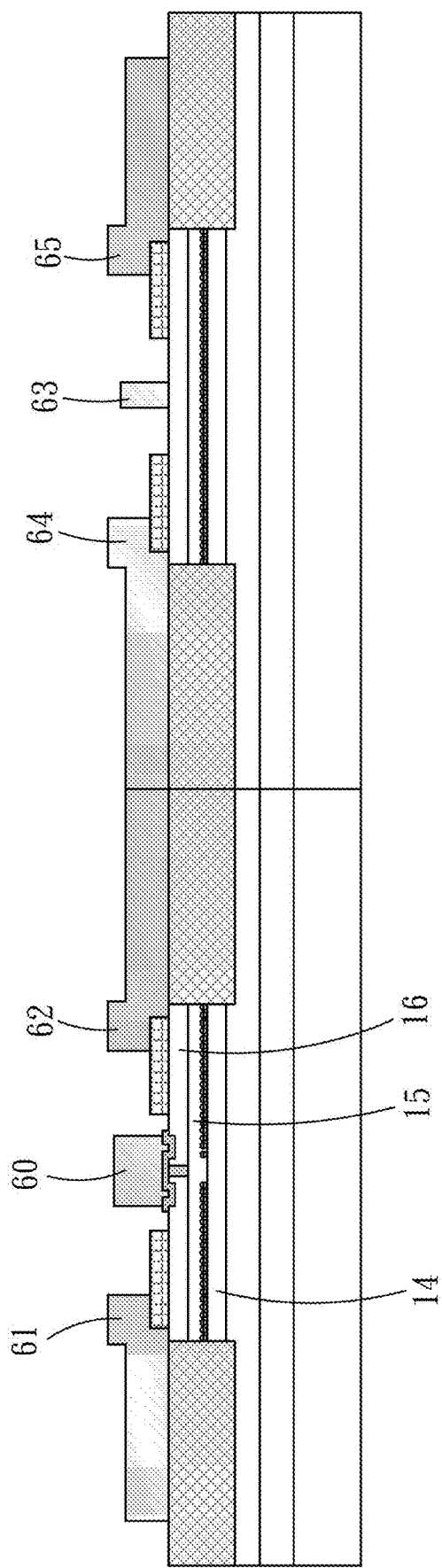
Figures 2, 7C:
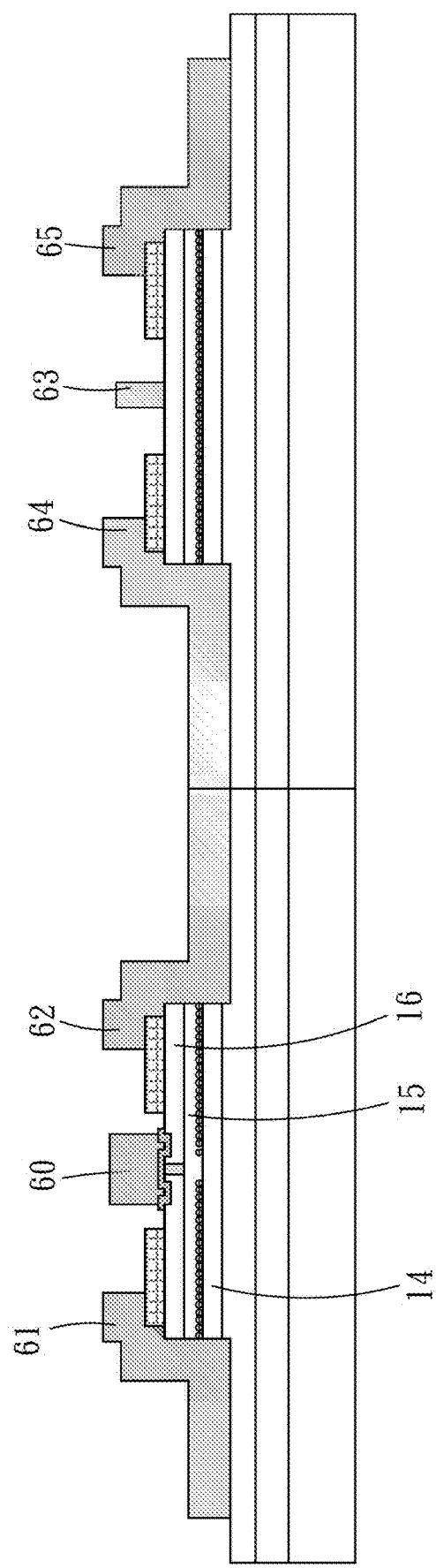

Please refer to FIG. 7C-1, which shows a schematic diagram of forming the gate electrode and the metal interconnect on the structure shown in FIG. 7B-1. As shown in the figure, by using metal vapor deposition (generally, Ni/Au) and metal lift-off method, the first gate electrode 60, the first drain metal interconnect 61, the first source metal interconnect 62, the second gate electrode 63, the second source metal interconnect 64, and the second drain metal interconnect 65 can be formed. Concurrently, the metal wiring required for device operations, such as the first gate bonding pad 80 connected with the first gate electrode 60, can be formed. Nonetheless, the top views in the figures according to the present invention are not used for limiting the scope of the present invention. In addition, FIG. 7C-2 shows a schematic diagram of forming the gate electrode and the metal interconnect on the structure shown in FIG. 7B-2. It is similar to FIG. 7C-1. Hence, the details will be not described again.

Next, likewise, PECVD is adopted for depositing a passivation dielectric layer 70 with compressive stress (dielectric constant n~1.45) or with tensile stress (dielectric constant n~2.0). The material is selected from the group consisting of $SiO_x$, $SiO_xN_y$, or $SiN_x$; the thickness is greater than 200 nm. Then the i-$Al_x$GaN layer 16/the i-GaN channel layer 15/the i-$Al_y$GaN layer 14 in the active region of the epitaxial layer will be inverted from the N-face polarity to the Ga-face polarity (polarity inversion). Furthermore, the N-face epitaxial structures 1, 2 and the passivation dielectric layer 70 according to the present invention can overcome the problem of current collapse. This is because as the passivation dielectric layer 70 becomes thicker, the compressive or expansive tensile stress exerted downwards by the passivation dielectric layer 70 becomes greater. When the stress reaches a certain level, the i-$Al_x$GaN layer 16/the i-GaN channel layer 15/the i-$Al_y$GaN layer 14 in the active region of the epitaxial layer will be inverted from the N-face polarity to the Ga-face polarity. At this time, the 2DEG 150 in the i-GaN channel layer 15 at the junction of the i-GaN channel layer 15/the i-$Al_y$GaN layer 14 will be moved to the junction of the i-$Al_x$GaN layer 16/the i-GaN channel layer 15. The accompanying advantages include first, the surface traps in the N-face i-AlGaN layer 16 are fewer. Thereby, the few shallow traps formed previously can be used to release the electrons captured by the surface traps in extremely small current. Secondly, because the bandgap of the i-$Al_y$-GaN layer 14 is wider, it can be used to block the electrons of buffer traps from entering the i-GaN channel layer 15. Finally, the passivation dielectric layer 70 is patterned to expose the bonding pads and hence completing the structure of FIGS. 6A and 6B.

Furthermore, the first gate electrode 60 and the first gate dielectric layer 50 will form fringe capacitors 51, 52, which will result in the field plate effect. The main function of the field plate effect is to distribute the high-density electric field below the first gate electrode 60 and the second gate electrode 63. In addition to increasing the breakdown voltage Vds between the drain and the source of the HEMT, it also suppresses the electron trapping effect below the first gate electrode 60 and the second gate electrode 63, and hence reducing current collapse during the operation of the HEMT.

Please refer to FIG. 8A-1, which shows a first structure diagram of a hybrid SBD formed by cascoding an E-mode N-face AlGaN/GaN HEMT with polarity inversion and gate moat structure and an AlGaN/GaN SBD according to the present invention. According to the fourth embodiment of the present invention, a hybrid N-face AlGaN/GaN SBD with polarity inversion is formed by cascoding an E-mode N-face AlGaN/GaN HEMT with polarity inversion of GaN and gate moat structure and an N-face AlGaN/GaN SBD with polarity inversion of GaN. The anode 90 of the N-face AlGaN/GaN SBD with polarity inversion is connected electrically with the first gate electrode 60. In addition, the first gate electrode 60, the anode metal 901, the cathode metal 93, and the cathode metal interconnect 66 can be formed concurrently. The anode 90 of the N-face AlGaN/GaN SBD with polarity inversion is applied with a positive voltage, in addition to turning on the SBD, the anode 90 also applies a positive voltage to the first gate electrode 60, making the E-mode N-face AlGaN/GaN HEMT with polarity inversion and gate moat structure turned on completely. Thereby, currents can be supplied to the cathode 91 smoothly. As the cathode 91 (the cathode metal 93) is supplied with a positive voltage, the voltage Vgs of the E-mode N-face AlGaN/GaN HEMT with polarity inversion and gate moat structure is negative. Thereby, the E-mode N-face AlGaN/GaN HEMT with polarity inversion and gate moat structure is turned off, which protects the N-face AlGaN/GaN SBD with polarity inversion from reverse-bias breakdown. Besides, because the current of the E-mode N-face AlGaN/GaN HEMT with polarity inversion and gate moat structure owns a negative temperature coefficient while the current of the N-face AlGaN/GaN SBD with polarity inversion owns a positive temperature coefficient, these two devices are complementary after cascoding. Accordingly, the currents of the hybrid device will be influenced easily by temperature given a fixed voltage.

This hybrid N-face AlGaN/GaN SBD with polarity inversion is characterized in that, as described above, no 2DEG 150 can exist in GaN below the first gate electrode 60 unless a positive voltage is applied. Accordingly, when the cathode 91 is applied with a reverse voltage, the reverse-bias breakdown voltage can be increased effectively and the reverse leakage current can be suppressed.

As shown in FIGS. 8A-1 and 8A-2, the hybrid N-face AlGaN/GaN SBD with polarity inversion according to the fourth embodiment mainly comprises the epitaxial structure of N-face AlGaN/GaN according to the present invention and is divided into a left region L1 and a right region R1. An E-mode N-face AlGaN/GaN HEMT with polarity inversion of GaN and gate moat structure is formed in the left region L1 and includes a fluorine-ion structure 160. Although the 2DEG 150 is formed in the i-GaN channel layer at the junction of the i-$Al_x$GaN layer 16/i-GaN channel layer 15, owing to the existence of the fluorine-ion structure 160, the 2DEG 150 in the i-GaN channel layer 15 and below the fluorine-ion structure 160 will be depleted. Besides, an N-face AlGaN/GaN SBD with polarity inversion having an anode field plate is formed in the right region R1.

The difference between the fabrication process according to the fourth embodiment and those according to the previous embodiments is that, after the ion implantation process of fluorine ions into the epitaxial structure of N-face AlGaN/GaN, the first source ohmic-contact electrode 30 and the first drain ohmic-contact electrode 31 are formed in the left region L1. Concurrently, the cathode ohmic-contact electrode 34 (cathode metal electrode) of the SBD is formed in the right region R1. Afterwards, an anode field-plate dielectric layer 92 is formed in the right region R1. Concurrently, the first gate dielectric layer 50 is formed in the left region L1.

Figure 8B:
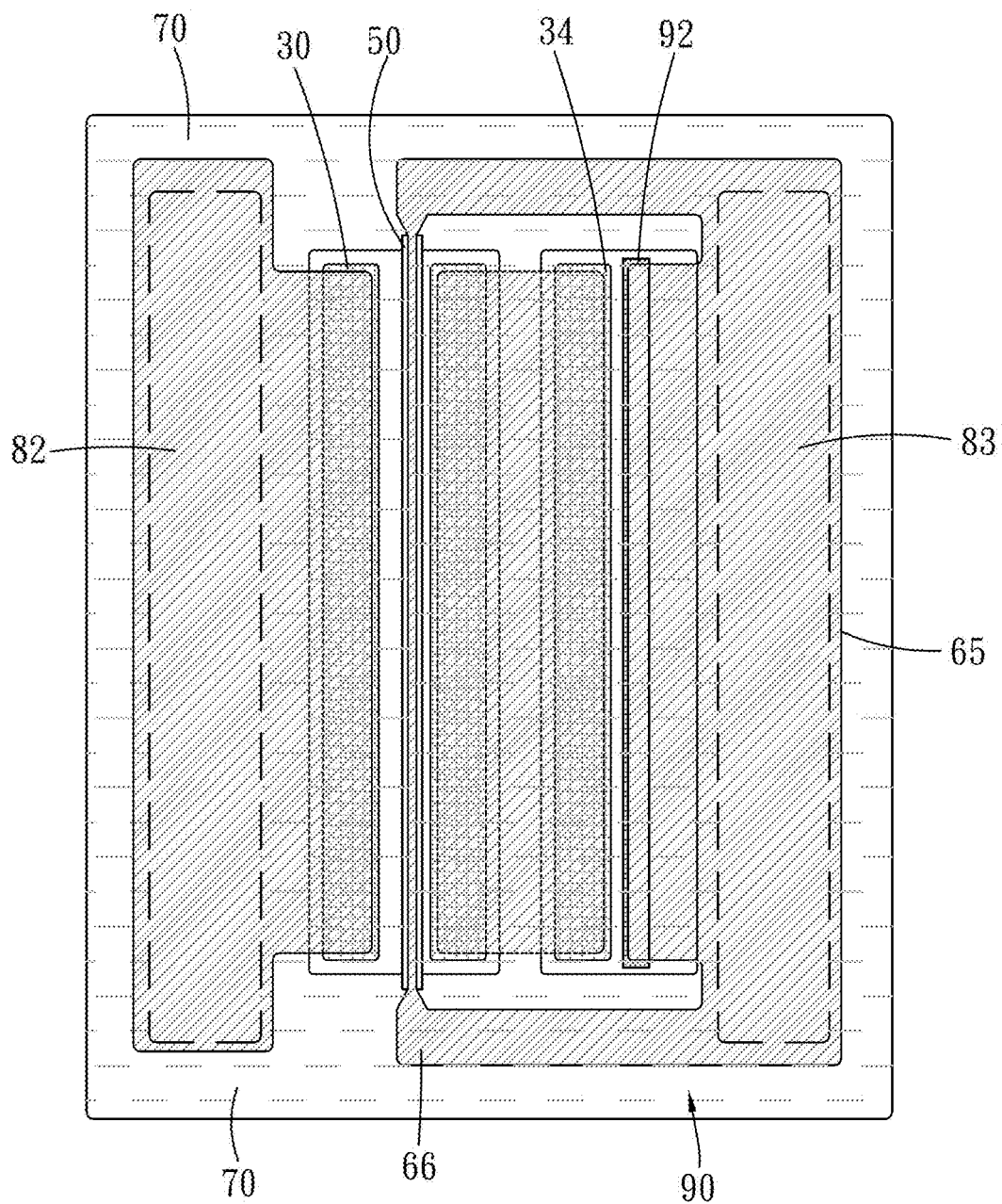
FIG. 8B shows a top view of a hybrid SBD formed by cascoding an E-mode N-face AlGaN/GaN HEMT with polarity inversion and gate moat structure and an AlGaN/GaN SBD according to the present invention.
Figure 8C:
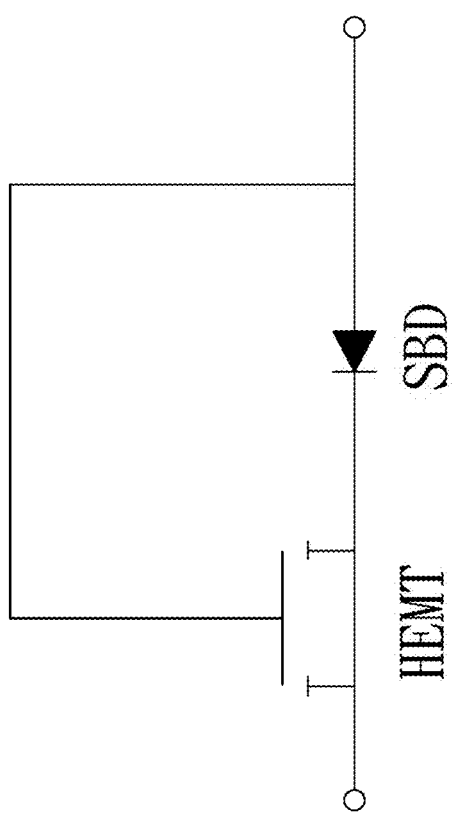
FIG. 8C shows an equivalent circuit diagram of a hybrid SBD formed by cascoding an E-mode N-face AlGaN/GaN HEMT with polarity inversion and gate moat structure and an AlGaN/GaN SBD according to the present invention.

Next, as described previously, form the first gate electrode 60 and the metal interconnect, including the first gate metal interconnect of the hybrid N-face AlGaN/GaN SBD with polarity inversion, the first source metal interconnect, the anode metal interconnect of the N-face AlGaN/GaN SBD with polarity inversion, and related metal wiring. In addition, a patterned passivation dielectric layer 70 is formed on the epitaxial structure of N-face AlGaN/GaN for exposing a portion of the passivation dielectric layer. Then the top view as shown in FIG. 8B will be formed.

FIG. 9B shows a top view of a hybrid AlGaN/GaN SBD formed by cascoding an E-mode N-face AlGaN/GaN HEMT with polarity inversion and gate moat structure and an AlGaN/GaN SBD according to the present invention. As shown in the figure, the anode electrode and the first gate electrode 60 of the hybrid N-face AlGaN/GaN SBD with polarity inversion use the first gate electrode 60 as the metal interconnect and connected electrically to each other (below the passivation dielectric layer 70). In addition, the anode metal interconnect of the hybrid N-face AlGaN/GaN SBD with polarity inversion includes the anode bonding pad 83, while the cathode metal 93 includes the source bonding pad 82.

What is claimed is:

1. A method for fabricating an enhancement-mode N-face AlGaN/GaN high electron mobility transistor with polarity inversion and gate moat structure, characterized in steps of:
  forming an epitaxial structure of N-face AlGaN/GaN, said epitaxial structure of N-face AlGaN/GaN comprising the steps of:
    providing a silicon substrate;
    depositing a C-doped buffer layer on said silicon substrate;
    depositing a C-doped GaN layer on said C-doped buffer layer;
    depositing an i-$Al_y$GaN layer on said C-doped GaN layer;
    depositing an i-GaN channel layer on said i-$Al_y$GaN layer; and
    depositing an i-$Al_x$GaN layer on said i-GaN channel layer;
  etching two gate moat structures on both side of a predetermined region for a fluorine-ion structure using dry etching, and implanting fluorine ions into said i-$Al_x$GaN layer using fluorine-ion plasma under a specific electric field (or a specific voltage), and performing a 425° C. thermal treatment for 600 seconds for enabling said fluorine-ion structure to occupy stably a space inside said i-$Al_x$GaN layer; and
  fabricating a first gate dielectric layer.

2. The method of claim 1, wherein said step of fabricating said first gate dielectric layer further comprises steps of:
  depositing a dielectric layer for forming said epitaxial structure of N-face AlGaN/GaN;
  using a photoresist for defining a region of said first gate dielectric layer by exposure and development;
  performing wet etching using buffered oxide etchant for removing said dielectric layer outside the region of said first gate dielectric layer, and reserving only the region for forming said first gate dielectric layer; and
  removing the photoresist by using photoresist stripper.

3. A method for fabricating a hybrid enhancement-mode N-face AlGaN/GaN high electron mobility transistor with polarity inversion, characterized in steps of:
  forming an epitaxial structure of N-face AlGaN/GaN, said epitaxial structure of N-face AlGaN/GaN comprising the steps of:
    providing a silicon substrate;
    depositing a C-doped buffer layer on said silicon substrate;
    depositing a C-doped GaN layer on said C-doped buffer layer;
    depositing an i-$Al_y$GaN layer on said C-doped GaN layer;
    depositing an i-GaN channel layer on said i-$Al_y$GaN layer; and
    depositing an i-$Al_x$GaN layer on said i-GaN channel layer;
  etching two gate moat structures on both side of a predetermined region for a fluorine-ion structure using dry etching, and implanting fluorine ions into said i-$Al_x$GaN layer using fluorine-ion plasma under a specific electric field (or a specific voltage), and performing a 425° C. thermal treatment for 600 seconds for enabling said fluorine-ion structure to occupy stably a space inside said i-$Al_x$GaN layer;
  fabricating a first gate dielectric layer and a second gate dielectric layer;
  dividing said epitaxial structure of N-face AlGaN/GaN into a left region and a right region;
  in said left region, forming an enhancement-mode N-face AlGaN/GaN high electron mobility transistor with polarity inversion of GaN and gate moat structure and including said fluorine-ion structure for controlling a two-dimensional electron gas below said fluorine-ion structure to be depleted, depositing a passivation dielectric layer with compressive stress (dielectric constant n~1.45) or with tensile stress (dielectric constant n~2.0) and with thickness greater than 200 nanometers, inverting said i-AlGaN layer/said i-GaN channel layer/said i-$Al_y$GaN layer in a active region of said epitaxial layer from the N-face polarity to the Ga-face polarity for raising said two-dimensional electron gas from a junction of said i-GaN channel layer/said i-$Al_y$GaN layer to a junction of said i-GaN channel layer/said i-$Al_x$GaN layer; and
  in said right region, forming a depletion-mode N-face AlGaN/GaN high electron mobility transistor with polarity inversion of GaN and gate dielectric layer, using a stress of said passivation dielectric layer to invert said i-$Al_x$GaN layer/said i-GaN channel layer/said i-$Al_y$GaN layer in the active region of said epitaxial structure and raise said two-dimensional electron gas from the junction of said i-GaN channel layer/said i-$Al_y$GaN layer to the junction of said i-GaN channel layer/said i-$Al_x$GaN layer, and including said second gate dielectric layer.

4. The method for fabricating a hybrid enhancement-mode N-face AlGaN/GaN high electron mobility transistor with polarity inversion of claim 3, characterized in steps of:
  using a metal vapor deposition and metal lift-off methods to form a first source electrode and a first drain electrode in said left region and a second source electrode and a second drain electrode in said right region; and
  performing a 700~900° C. thermal treatment for 30 seconds for enabling said first source electrode, said first drain electrode, said second source electrode, and said second drain electrode to become ohmic-contact electrodes.

5. The method for fabricating a hybrid enhancement-mode N-face AlGaN/GaN high electron mobility transistor with polarity inversion of claim 4, characterized in a step of using the metal vapor deposition and metal lift-off methods to form a first gate electrode, a first source metal interconnect, a first drain metal interconnect, a second source metal interconnect, a second drain metal interconnect, and a second gate electrode; where said first gate electrode is located on said first gate dielectric layer; said first source metal interconnect is located on said first source electrode; said second gate electrode is located on said second gate dielectric layer; and said second drain metal interconnect is located on said second drain electrode.

6. A method for fabricating a hybrid N-face AlGaN/GaN Schottky barrier diode with polarity inversion, characterized in steps of:

forming an epitaxial structure of N-face AlGaN/GaN, said epitaxial structure of N-face AlGaN/GaN comprising the step of:
provide a silicon substrate;
depositing a C-doped buffer layer on said silicon substrate;
depositing a C-doped GaN layer on said C-doped buffer layer;
depositing an i-Al$_y$GaN layer on said C-doped GaN layer;
depositing an i-GaN channel layer on said i-Al$_y$GaN layer; and
depositing an i-Al$_x$GaN layer on said i-GaN channel layer;

etching two gate moat structures on both side of the predetermined region for a fluorine-ion structure using dry etching, and implanting fluorine ions into said i-Al$_x$GaN layer (x=0.1~0.3) using fluorine-ion plasma under a specific electric field (or a specific voltage), and performing a 425° C. thermal treatment for 600 seconds for enabling said fluorine-ion structure to occupy stably a space inside said i-Al$_x$GaN layer;

fabricating a first gate dielectric layer and an anode field-plate dielectric layer;

dividing said epitaxial structure of N-face AlGaN/GaN into a left region and a right region;

in said left region, forming an enhancement-mode N-face AlGaN/GaN high electron mobility transistor with polarity inversion of GaN and gate moat structure and including said fluorine-ion structure for controlling a two-dimensional electron gas below said fluorine-ion structure to be depleted, depositing a passivation dielectric layer with compressive stress (dielectric constant n~1.45) or with tensile stress (dielectric constant n~2.0) and with thickness greater than 200 nanometers, inverting said i-Al$_x$GaN layer/said i-GaN channel layer/said i-Al$_y$GaN layer in a active region of said epitaxial layer from the N-face polarity to the Ga-face polarity for raising said two-dimensional electron gas from a junction of said i-GaN channel layer/said i-Al$_y$GaN layer to a junction of said i-GaN channel layer/said i-Al$_x$GaN layer; and in said right region, forming an N-face AlGaN/GaN Schottky barrier diode with polarity inversion and having said anode field-plate dielectric layer, and using a stress of said passivation dielectric layer to invert said i-Al$_x$GaN layer/said i-GaN channel layer/said i-Al$_y$GaN layer in the active region of said epitaxial structure and raise said two-dimensional electron gas from the junction of said i-GaN channel layer/said i-Al$_y$GaN layer to the junction of said i-GaN channel layer/said i-Al$_x$GaN layer.

7. The method for fabricating a hybrid N-face AlGaN/GaN Schottky barrier diode with polarity inversion of claim 6, characterized in steps of:

using a metal vapor deposition and metal lift-off methods to form a first source electrode and a first drain electrode in said left region and a cathode electrode in said right region; and performing a 700~900° C. thermal treatment for 30 seconds for enabling said first source electrode, said first drain electrode, and said cathode electrode to become ohmic-contact electrodes.

8. The method for fabricating a hybrid N-face AlGaN/GaN Schottky barrier diode with polarity inversion of claim 7, characterized in a step of using the metal vapor deposition and metal lift-off methods to form a first gate electrode, a first source metal interconnect, a first drain metal interconnect, a cathode metal interconnect, and an anode metal interconnect; where said first gate electrode is located on said first gate dielectric layer; said first source metal interconnect is located on said first source electrode; and said anode metal interconnect is formed on said anode field-plate dielectric layer.

* * * * *